United States Patent [19]

Toda et al.

[11] Patent Number: 5,518,360
[45] Date of Patent: May 21, 1996

[54] WAFER CARRYING DEVICE AND WAFER CARRYING METHOD

[75] Inventors: Masayuki Toda; Takashi Onoda, both of Yonezawa; Tadahiro Ohmi, Sendai; Masaru Umeda, Tokyo; Yoichi Kanno, Sendai, all of Japan

[73] Assignee: Kabushiki-Kaisha Watanabe Shoko, Tokyo, Japan

[21] Appl. No.: 50,462

[22] PCT Filed: Oct. 28, 1991

[86] PCT No.: PCT/JP91/01469

§ 371 Date: May 17, 1993

§ 102(e) Date: May 17, 1993

[87] PCT Pub. No.: WO92/09103

PCT Pub. Date: May 29, 1992

[30] Foreign Application Priority Data

Nov. 16, 1990 [JP] Japan .................................. 2-308871

[51] Int. Cl.⁶ .................................................. F16C 32/06
[52] U.S. Cl. .......................... 414/755; 414/935; 414/936; 384/12
[58] Field of Search .................................. 414/676, 755, 414/935, 936; 384/12

[56] References Cited

U.S. PATENT DOCUMENTS

| | | | |
|---|---|---|---|
| 3,797,889 | 3/1974 | Wilkinson | 414/936 |
| 3,923,342 | 12/1975 | Shannon | 414/936 |
| 4,242,038 | 12/1980 | Santini et al. | 414/755 |
| 4,618,292 | 10/1986 | Judge et al. | 414/936 |
| 5,108,513 | 4/1992 | Muller et al. | 414/755 |
| 5,314,538 | 5/1994 | Maeda et al. | 414/935 |

FOREIGN PATENT DOCUMENTS

| | | |
|---|---|---|
| 55-38828 | 10/1980 | Japan . |
| 4022 | 1/1984 | Japan ................................ 414/755 |
| 59-215718 | 12/1984 | Japan . |

*Primary Examiner*—David A. Bucci
*Assistant Examiner*—Gregory A. Morse
*Attorney, Agent, or Firm*—Baker & Daniels

[57] ABSTRACT

A device for carrying a thin plate-like substrate such as a semiconductor wafer and controlling its position by floating it with an inert gas of low impurity concentration. A transferring unit and a controlling unit are respectively provided with gas nozzles for floating a thin plate-like substrate and with a gas exhausting and circulating system, and a plurality of them are in combination with each other in a sealing state. The controlling unit, further, has a vacuum suction hole at its controlling center, and is provided with nozzles for controlling the thin plate-like substrate in its radial and circumferential direction respectively and with nozzles for stopping the thin plate-like substrate or sending out it to the next unit too. On the bottom of a control space, grooves extending from the vacuum suction hole are formed for improving the positional accuracy of stopping the thin palate-like substrate, and they are closed on the insides of their circumferential part when the center of the thin plate-like substrate has coincided with the controlling center of the controlling unit.

12 Claims, 26 Drawing Sheets

FIG. I

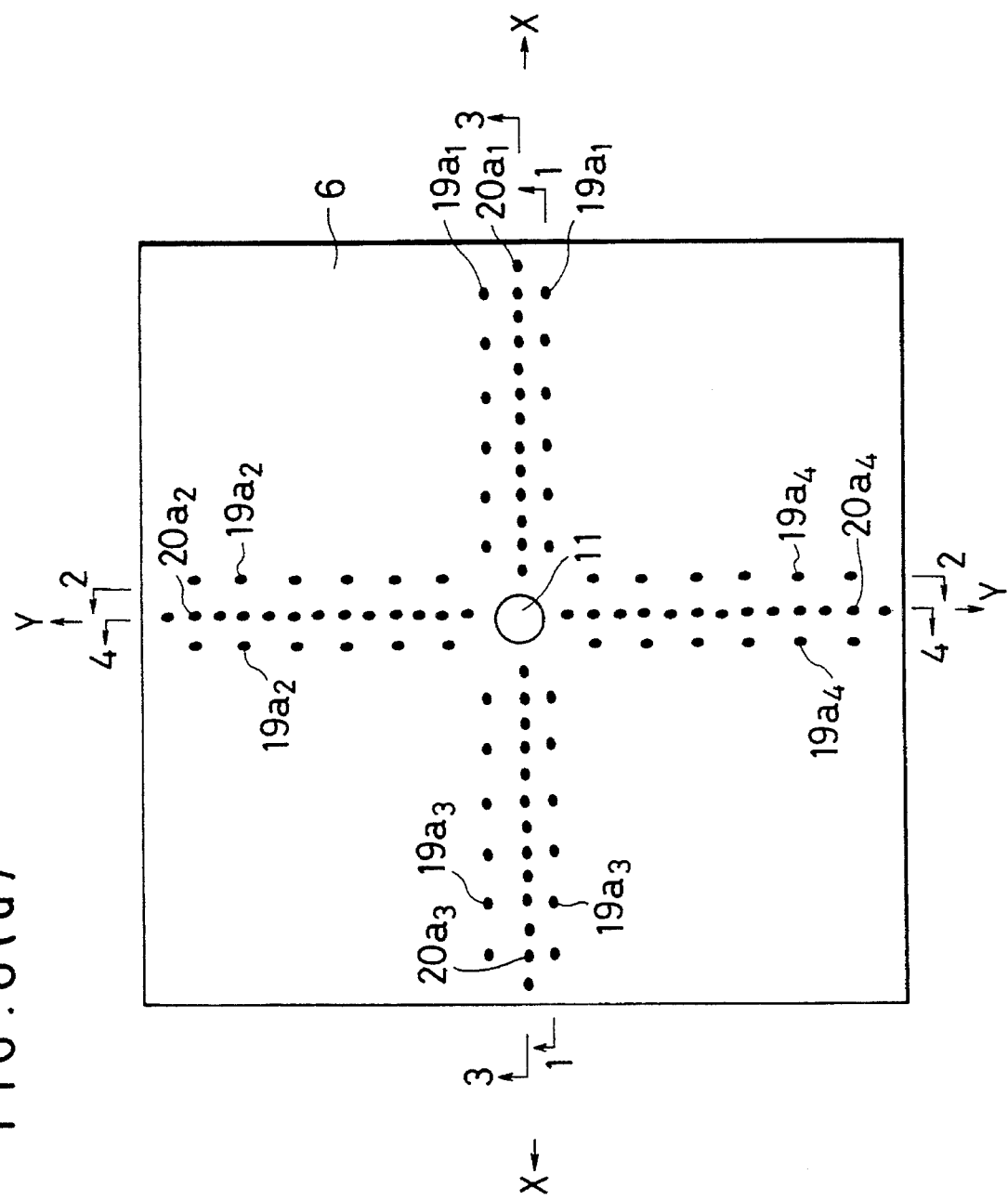

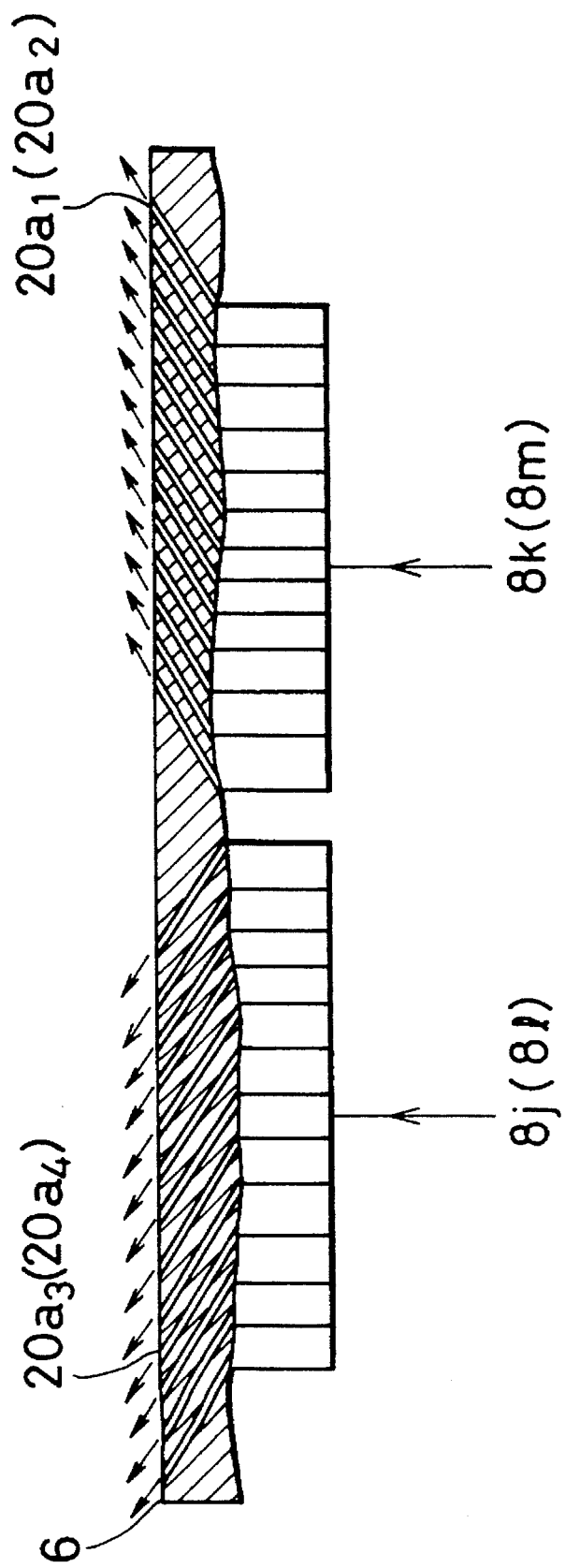

FIG. 16
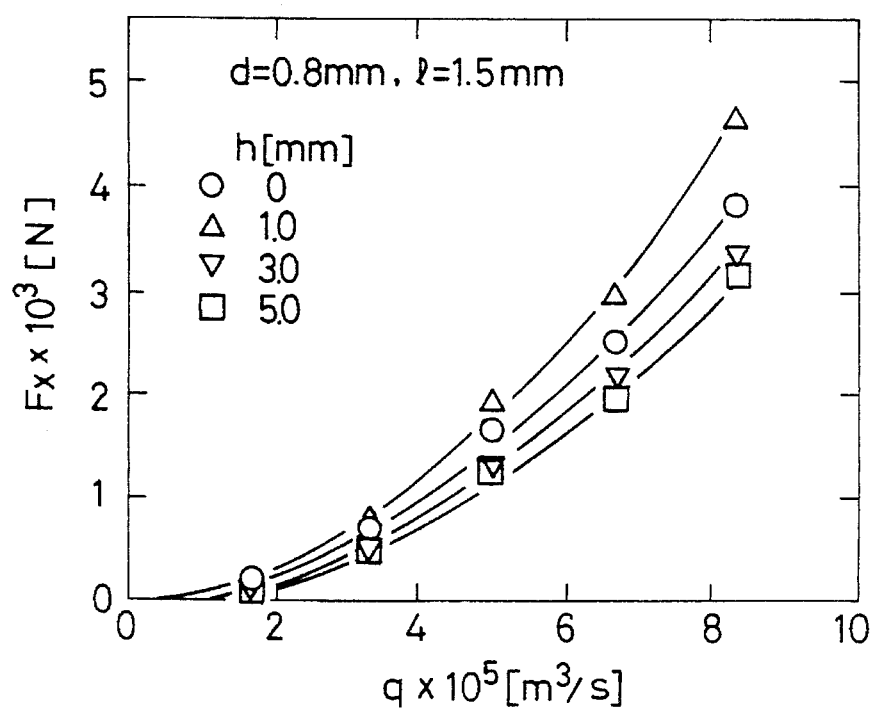
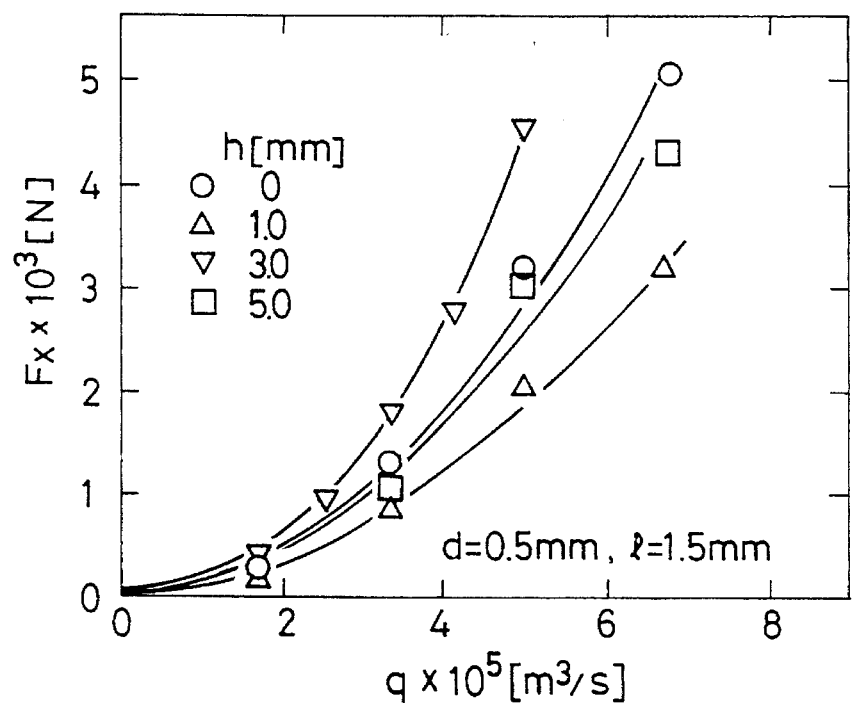

RELATION BETWEEN Fx AND FLOW RATE OF GAS

RELATION BETWEEN Fn AND FLOW RATE OF GAS

RELATION BETWEEN Fx AND FLOW RATE OF GAS

RELATION BETWEEN Fn AND FLOW RATE OF GAS

WAFER CARRYING DEVICE AND WAFER CARRYING METHOD

TECHNICAL FIELD

The present invention relates to a sheet-like base or wafer carrying device and a sheet-like base or wafer carrying method, more particularly to a sheet-like base carrying device and a sheet-like base or wafer carrying method by which a sheet-like base or wafer can be maintained in a stationary condition while it is floating and the accuracy of the amplitude of vibration caused in the sheet-like base or wafer can be maintained in a range of 0.2 mm in a stationary condition, and further the contamination of the sheet-like base or wafer can be prevented.

According to the present invention, the sheet-like base or wafer can be carried in an ultra-clean atmosphere. The sheet-like base or wafer carrying system by which the sheet-like base or wafer can be carried in an ultra-clean atmosphere is referred to as an ultra-clean-floating-traffic-system (UCFT).

BACKGROUND ART

As a technique to carry a wafer by a fluid current, there is disclosed in Japanese Patent Publication Laid Open No. 38828-1980 such that a groove is formed on the surface of an orbit and by injecting fluid along the groove, a vacuum condition is created when the fluid is sucked into the groove from a thin film of fluid.

This technique is excellent in its performance when it is applied to a carrying mechanism.

However, the inventors have found various following problems when the aforementioned carrying device is put into practical use.

First, it is difficult to maintain a wafer in a stationary condition at a predetermined position. For example, in the ease where the wafer is introduced Into a film forming chamber, it is desired that the discrepancy of the stationary position of the wafer from a predetermined position is in a range of ±0.2 min.

Therefore, it is necessary to guide the wafer to a predetermined position with an accuracy of ±0.2 min. Next, it is necessary to make the wafer stand still at the position without causing vibration In the wafer.

The inventors attempted to make the wafer stand still with the accuracy in accordance with the aforementioned conventional technique, however, it was difficult to maintain the wafer in a stationary condition with such accuracy. Further, there were no carrying devices capable of making the wafer stand still with the aforementioned accuracy.

After all, according to the conventional carrying device, vibrations were caused in the radial, circumferential and horizontal directions when the wafer was in a stationary condition, and the amplitude of the vibration far exceeded 0.2 mm.

Secondarily, it was found that the predetermined characteristics of the wafer could not be necessarily obtained in the case where the wafer was carried with the conventional carrying device and subjected to processing such as film forming or etching. For example, when an oxide film was formed on the wafer, its insulating property was not good, and when the wafer was subjected to etching, an etching with high selectivity could not be performed. As a result of investigations made by the inventors to ascertain its cause, it was found that impurities such as particles and moisture were deposited on the surface of the wafer deteriorating the processability. As a result of further various investigations, it was found that such impurities had been deposited on the wafer while the wafer was being carried. Especially, It was found that particles had been remarkably generated.

The aforementioned problems have not been known until now, being found by the inventors for the first time.

OBJECT OF THE INVENTION

A primary object of the present invention is to provide a sheet-like base carrying device and a sheet-like base carrying method by which a sheet-like base can be maintained in a stationary condition with an accuracy of ±0.2 mm, and further the contamination of the sheet-like base can be prevented while being carried.

DISCLOSURE OF THE INVENTION

In order to solve the aforementioned problems, the present invention is to provide a sheet-like base carrying device in which a plurality of transfer units having a transfer space to allow a sheet-like base to advance linearly and a plurality of control units having a control space to control the movement of the sheet-like base, are combined in an airtight condition, said sheet-like base carrying device comprising: a plurality of jet holes for floating the sheet-like base, said jet holes being formed on the lower surface of the transfer space and connected with a gas supply system; an exhaust means provided at an appropriate position in the transfer space so as to exhaust the gas from the transfer space; an exhaust means provided at an appropriate position in the control space so as to exhaust the gas from the control space; a suction hole formed in an approximately central portion on the lower surface in the control space (the central portion is referred to as "a control center", hereinafter), said suction hole being connected with a vacuum exhaust system; a groove formed on the lower surface of the control space and extending from the suction hole; a plurality of jet holes for controlling the position of the sheet-like base in a radial direction, the jet holes being formed on the lower surface of the control space; a plurality of jet holes groups for controlling the position of the sheet-like base in a circumferential direction, the jet holes groups being formed on the lower surface of the control space; a plurality of jet holes for floating the sheet-like base, said Jet holes being formed on the lower surface of the control space; and a plurality of jet holes for stopping or carrying the sheet-like base to the next unit, the jet holes being formed on the lower surface of the control space, wherein said groove is closed inside the periphery of the sheet-like base when the center of the sheet-like base has come to a position above the control center.

Also, in a sheet-like base carrying method of the present invention when carrying a sheet-like base with a sheet-like base carrying device comprising a plurality of transfer units having a transfer space to allow the sheet-like base to advance linearly combined with a plurality of control units having a control space to control the movement of the sheet-like base in an airtight condition, is characterized in that a current of inert gas, the impurity concentration of which is not more than several ppb, is used when the sheet-like base is carried with the sheet-like base carrying device.

BRIEF DESCRIPTION OF THE DRAWINGS

FIG. 8(a) is a perspective view showing the arrangement of jet holes for stopping and sending of the control unit of the carrying device of the example of the present invention;

FIG. 8(c) Is a sectional view taken on line 3—3 in FIG. (a);

FIG. 11 to FIG. 22(b) are views showing the relation between a gas flow and a force applied to a wafer in the case where a pocket is provided in the hole of a plate.

BEST MODE FOR CARRYING OUT THE INVENTION

The present invention will be explained in detail based on an example. It should be understood that the present invention is not limited by the specific example.

Figure 1:
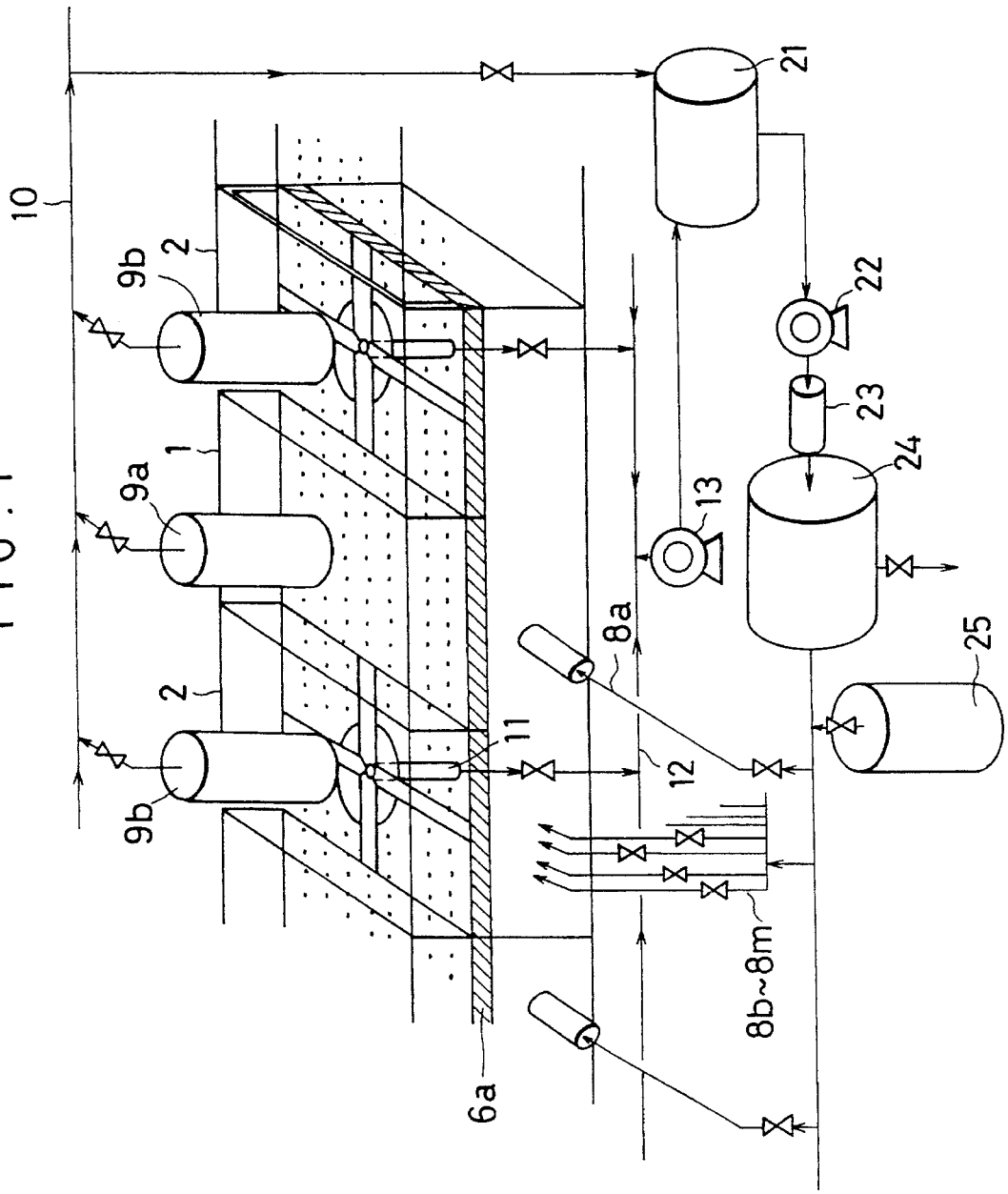
FIG. 1 is a schematic illustration of a carrying device relating to the example of the present invention.

FIG. 1 shows the entire structure of an example of the carrying device for a sheet-like base (for example, a wafer) according to the present invention.

The structure of each unit will be explained as follows.

The sheet-like base carrying device of this example essentially includes a transfer unit 1 having a transfer space to allow a sheet-like base to advance linearly and a control unit 2 having a control space to control the movement of the sheet-like base, wherein a plurality of transfer units 1 and control units 2 are combined.

Figure 2:
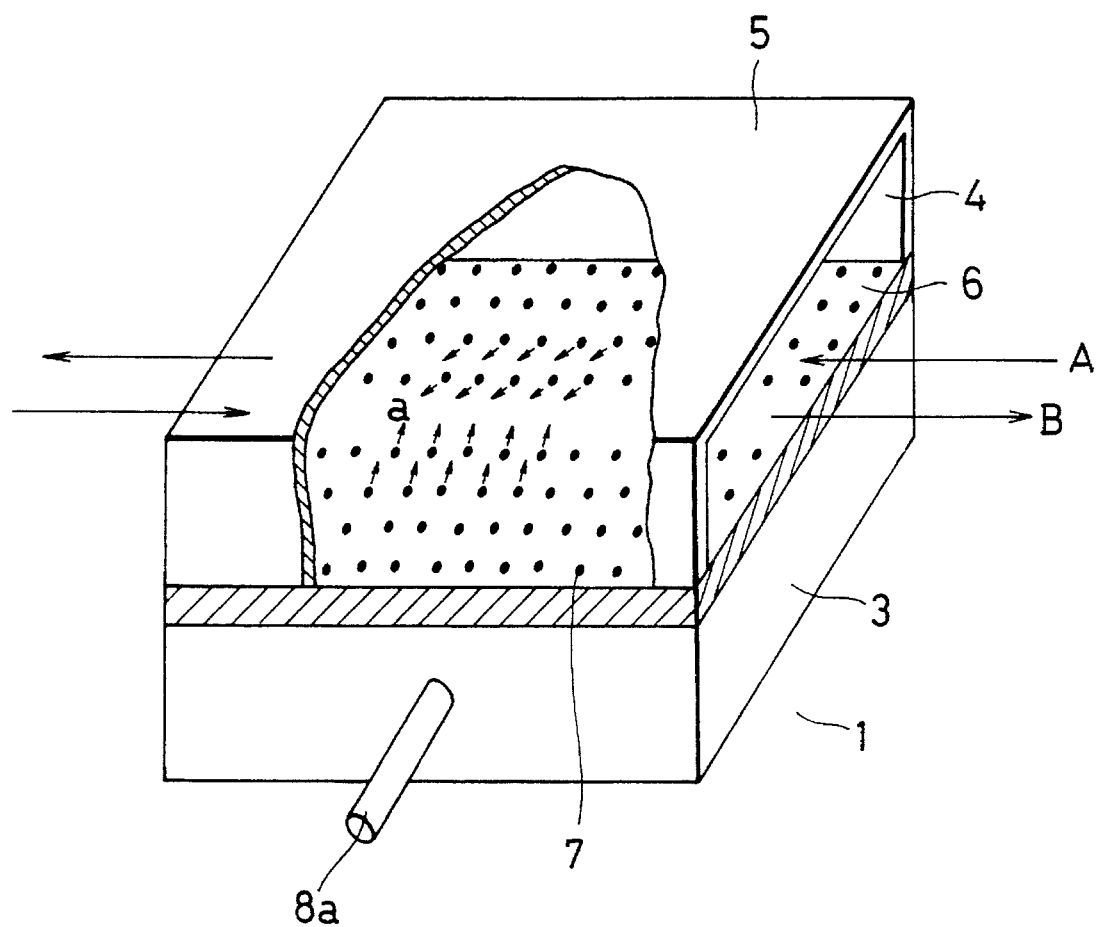
FIG. 2 is a partially broken view of a transfer unit relating to the example of the present invention.

FIG. 2 shows the detail of the transfer unit 1. FIG. 2 is a partially broken view of the transfer unit 1.

The transfer unit 1 is essentially composed of a base mount 3 and a transfer space 4.

The transfer space 4 is basically formed from a surrounding member 5 and an upper surface of the base mount 3 and in the drawing, the transfer space 4 is open in the left and right, and a sheet-like base is transferred to an adjacent control or transfer unit through this opening.

A plurality of jet holes for floating the sheet-like base are provided on the lower surface 6 of the transfer space 4, (the upper surface of the base mount 3). Each of the jet holes 7 for floating the sheet-like base is connected with a gas supply system 8a.

In this example, each of the jet holes 7 is disposed in a plane which is perpendicular to the traveling direction of the sheet-like base (shown by character A or B in the drawing). Incidentally, in this example each jet hole 7 is open to the lower surface 6, forming an angle of about 22° between the center line of the nozzle 7 and the lower surface 6. Of course, this angle is not necessarily limited to 22°. Further, the angles of the jet holes 7 have not to be necessarily the same. For example, the angle of a jet hole being far away from the center line may be small, and as it comes closer to the center line the angle of a jet hole may be large.

In the case where gas is blown out from the jet holes for floating, the gas is blown out In the direction indicated by arrow "a" shown in FIG. 2. Therefore, the gas is blown out against the back surface of a sheet-like base passing through the transfer unit 1, so that the sheet-like base is prevented from being lowered and being contacted with the lower surface 6.

A gas passage (not shown) connected with each jet hole 7 for floating is provided in the base mount 3, and each jet hole 7 for floating is communicated with the gas supply system 8a through this gas passage.

As shown in FIG. 1, an exhaust means 9a to exhaust gas from the transfer space 4 to the outside is provided in the transfer space 4. In this example, the exhaust means 9a is disposed in the upper portion of the surrounding member 5, and connected with a gas exhaust line 10.

In the present invention, only the jet holes approximately perpendicular to the traveling direction of the sheet-like base and open upward, are formed on the lower surface 6 of the transfer space 4, and there are no jet holes parallel or open diagonally to the traveling direction of the sheet-like base. Therefore, It is possible to ensure the floating height of a wafer by a smaller amount of gas, and the traveling speed of the wafer can be prevented from increasing acceleratively and made to be a constant speed.

Next, the control unit will be explained.

Figure 3A:
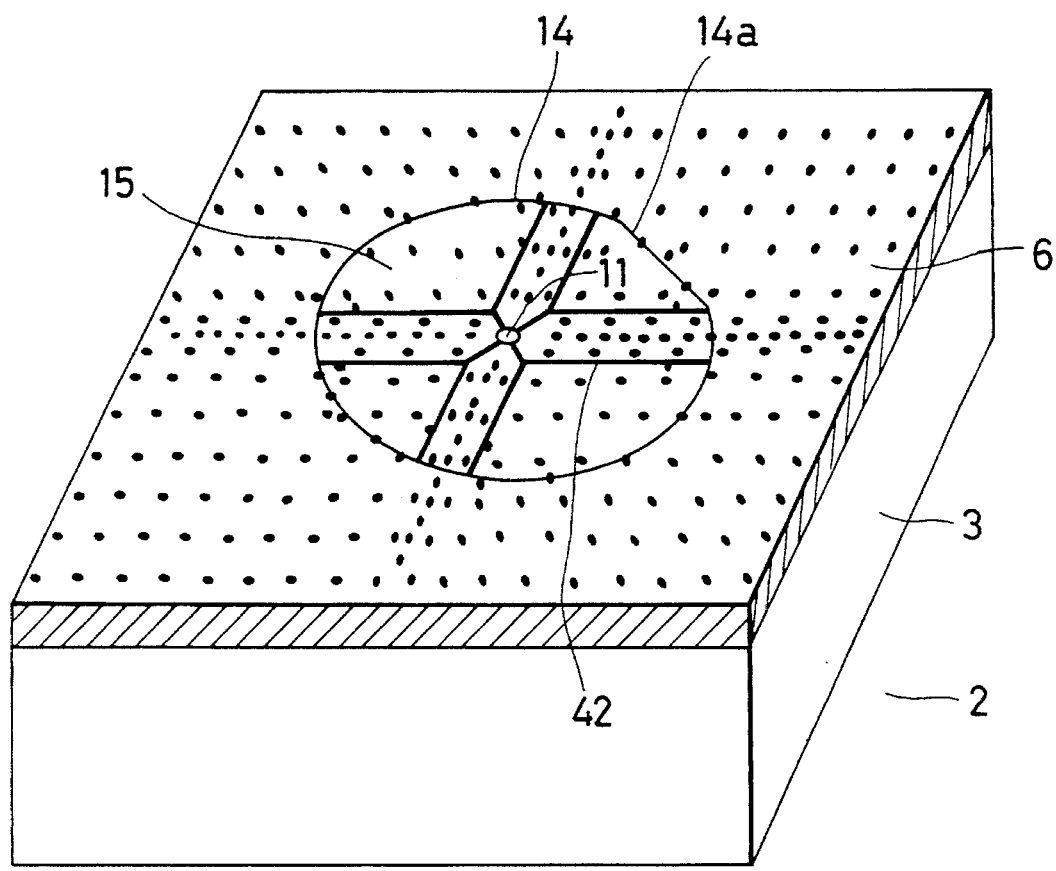
FIG. 3(a) is a perspective view showing the lower surface of the control unit of the carrying device of the example of the present invention.
Figure 3B:
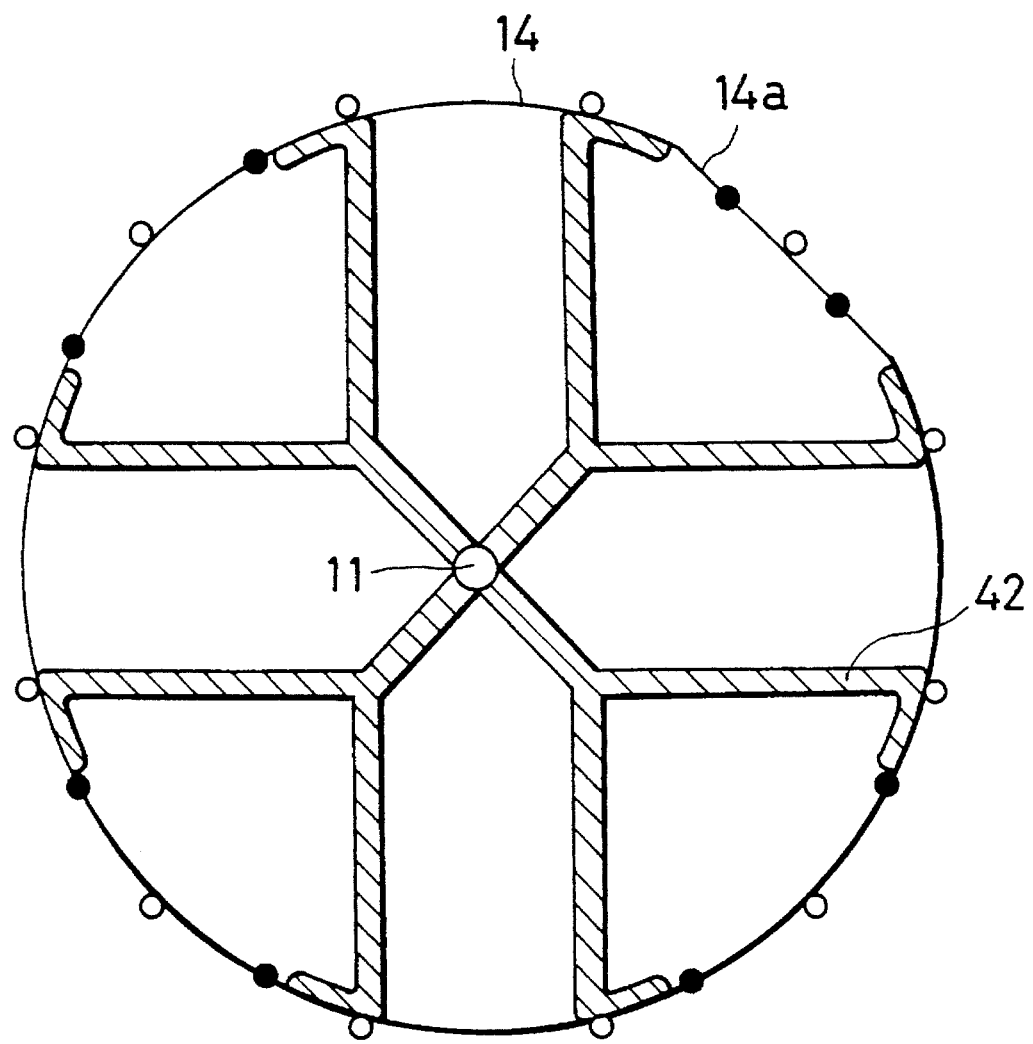
FIG. 3(b) is an enlarged view of the groove portion shown in FIG. 3(a)

FIGS. 3(a) and 3(b) shows the entire structure of the control unit. In the same manner as the transfer unit 1, the control unit 2 is essentially composed of a control space and a base mount 3. In the same manner as the transfer space, the control space is composed of a surrounding member and an upper surface of the base mount 3, although not shown in FIGS. 3(a) and 3(b). However, the control space in this example, is open in four directions so that the sheet-like base can be carried to the right and left, and also upward and downward as shown in the drawing.

A suction hole 11 is provided approximately in the control center of the lower surface of the control space 6 of the control unit 2, (the center of the position where the sheet-like base is to be stopped).

The suction hole 11 is connected with a vacuum exhaust line 12, and the vacuum exhaust line 12 is further connected with an ultra-clean exhaust pump 13. Accordingly, when the ultra-clean exhaust pump 13 is operated, the suction hole 11 can be given a negative pressure through the vacuum exhaust line 12.

A groove 42 (a black portion in FIG. 3(a)) extending outside from the suction hole 11 is provided on the lower surface of the control space. In this example, the groove 42 is symmetrically formed with the suction hole 11 as the center.

This example is characterized in that the groove 42 is closed at the periphery 14 of the sheet-like base or wafer 15. The inventors have found that the configuration of the groove is important for stopping and making the sheet-like base or wafer 15 stand still with a high accuracy of ±0.2 mm, and the inventors have also found that it is important to determine how far the groove 42 is extended. When the groove 42 is closed at the periphery of the sheet-like base or wafer 15, it becomes possible to stop the sheet-like base with high accuracy although it is not clear yet why the sheet-like base or wafer 15 can be stopped with high accuracy when the groove 42 is closed at the periphery of the sheet-like base or wafer 15.

The reason why the sheet-like base can not be stopped with a high accuracy by the aforementioned conventional technique is assumed to be as follows:
According to the conventional technique, a negative pressure condition is created when gas is blown out into the groove which necessitates communication of the groove with the outside in order to release the gas. For that reason, the vacuum condition created by the gas is not stable, so that the sheet-like base can not be stopped or maintained in a stationary condition with high accuracy.

An orientation flat 14a is formed in a portion of the periphery 14 of the sheet-like base or wafer 15 shown in FIGS. 3(a) and 3(b) so that the groove 42 is accommodated at the periphery 14 even in the portion of the orientation flat 14a.

In the case where the sheet-like base is stopped at a predetermined position in the control space of the control unit, by performing evacuation through the suction hole 11, the sheet-like base can be maintained in a stationary condition.

In order to detect the position of the sheet-like base 15, a detection means such as an optical fiber tube may be provided in an appropriate position.

On the lower surface 6 of the control space, are provided jet holes for floating, jet holes for controlling in a radial direction, jet holes for stopping and jet holes circumferential direction, jet holes for stopping and jet holes for ejection delivery.

Figure 4:
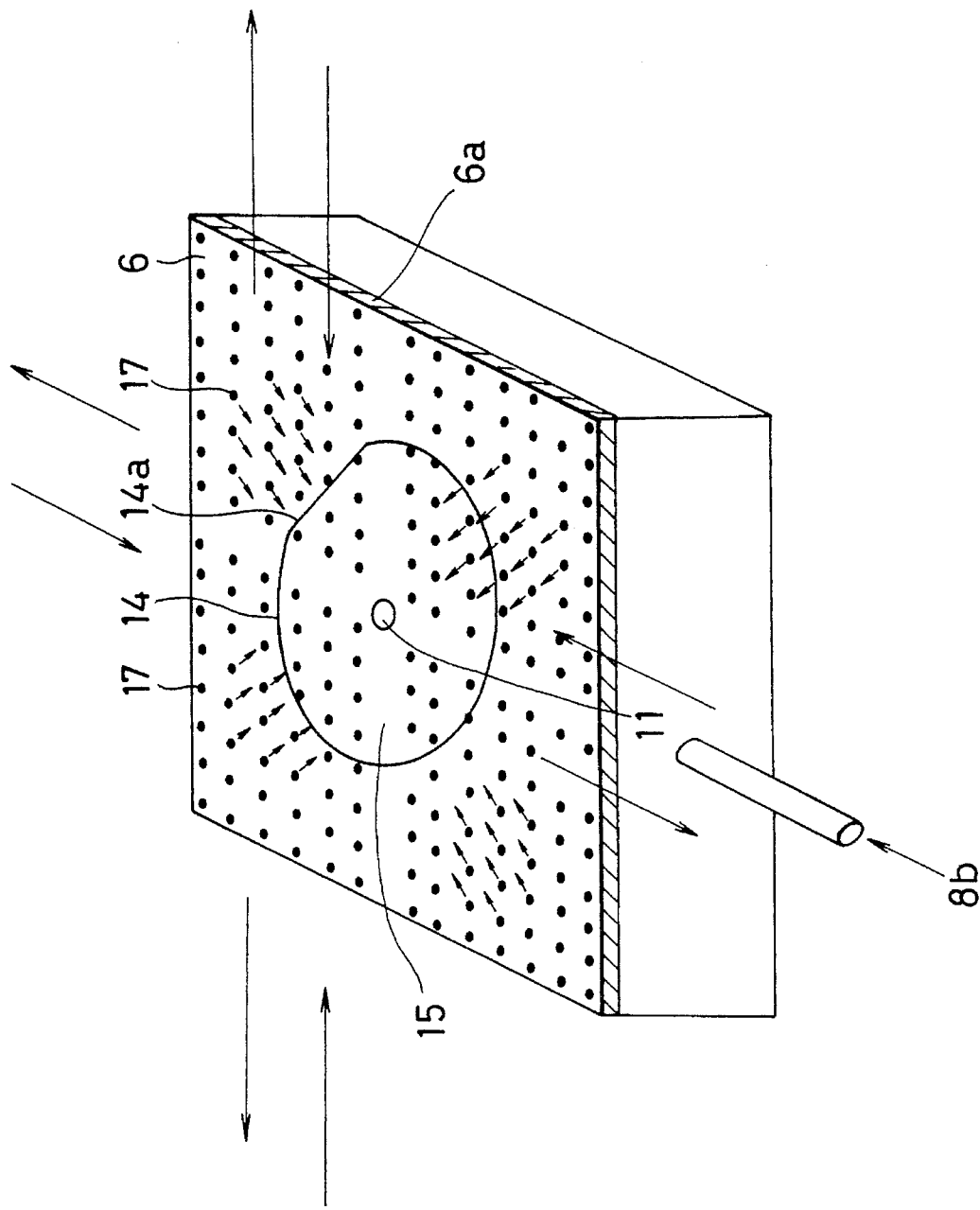
FIG. 4 is a perspective view showing the arrangement of the jet holes for floating the control unit of the carrying device of the example of the present invention.

In FIG. 4, the jet holes are shown for floating, omitting those after than for floating.

The jet holes for floating are provided all over the lower surface 6.

Each jet hole 17 (indicated by a black spot in FIG. 4) is open to the control center. In this example, each jet hole 17 forms an angle of 22° with respect to the lower surface, however, it should be understood that the present invention is not limited to the specific example. That is, any angles may be adopted as far as the jet holes are open to blow out the gas against the back surface of a sheet-like base when being above the control center to prevent the sheet-like base from coming into contact with the lower surface.

These jet holes 17 for floating are connected with the gas supply system 8b.

Figure 5:
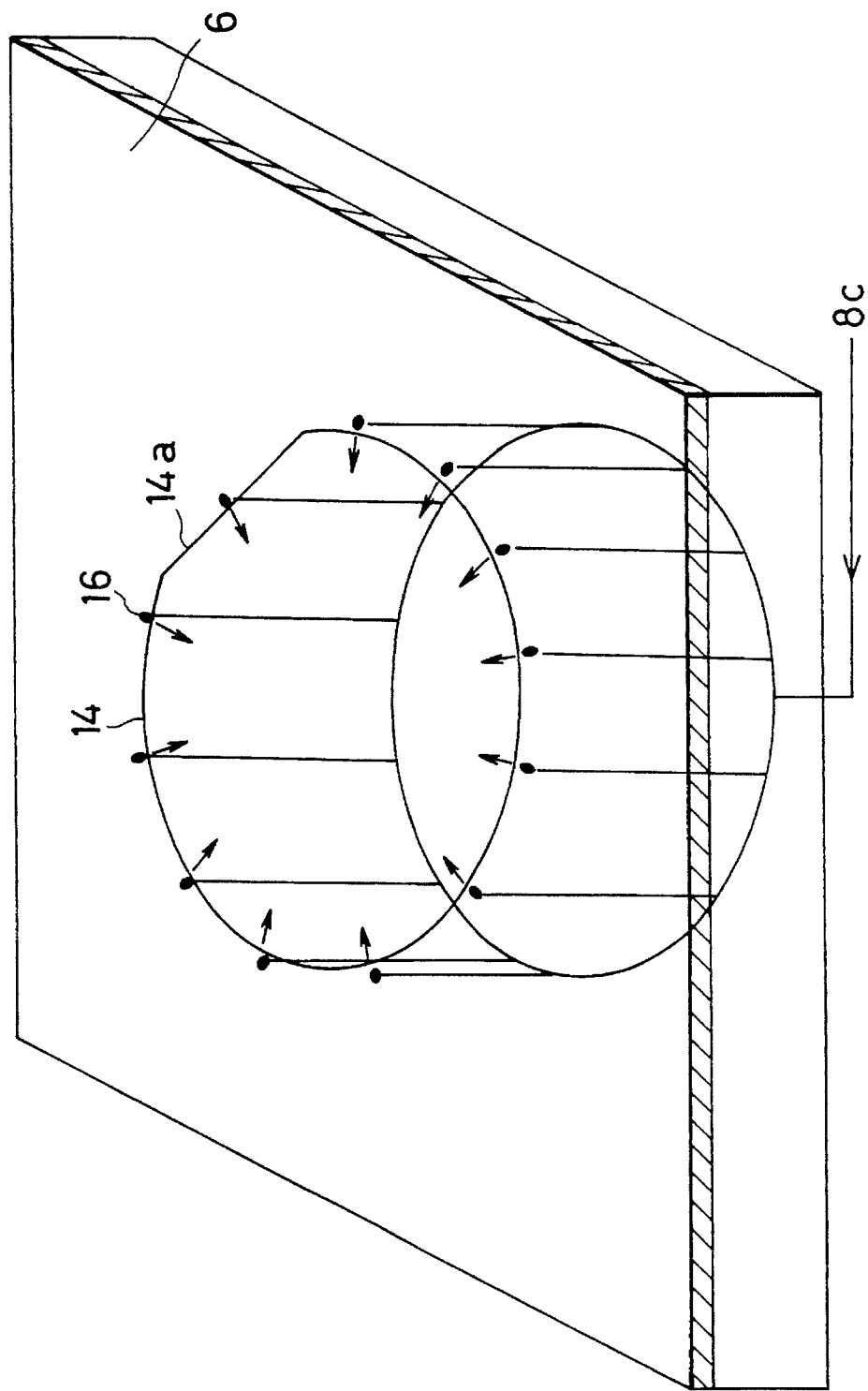
FIGS. 5 and 6 are perspective views showing the arrangement of jet holes for controlling in a radial direction of the control unit of the carrying device of the example of the present invention.
Figure 6:
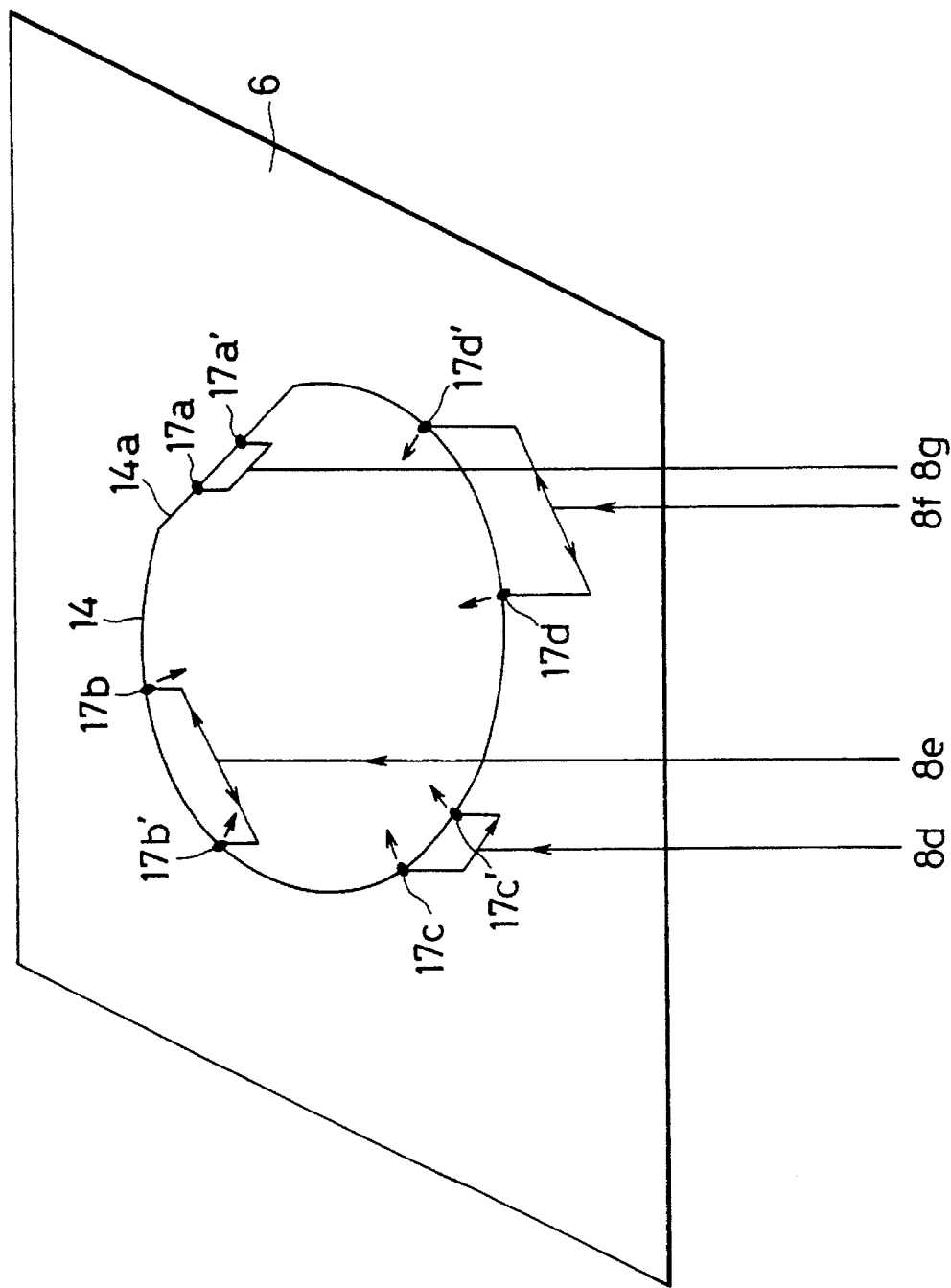

Next, with reference to FIGS. 5 and 6, the jet holes for controlling in a radial direction will be explained as follows.

The jet holes 16 for controlling in a radial direction are shown by black dots in the drawing. These jet holes 16 for controlling in a radial direction are provided for adjusting a position of the sheet-like base in a radial direction.

The jet holes 16 for controlling in a radial direction are pointing to the control center, and in this example, they open onto the lower surface 6 forming an angle of 22°. Therefore, when gas is blown out from the jet holes 16 for controlling in a radial direction, the position of the sheet-like base can be adjusted to the center.

These jet holes 16 for controlling in a radial direction are provided a bit outside of the periphery 14 of the sheet-like base or wafer 15. The orientation jet holes 16 at flat 14a are also provided a bit outside of the periphery 14 of the sheet like base or wafer 15. For example, in the case of a sheet-like base or wafer of 150 mm, the jet holes 16 at the orientation flat 14a are preferably provided outside of the periphery of the sheet like base or wafer 15 by 1 to 3 mm in order to quickly adjust the position in a radial direction, and more preferably the jet holes 16 at orientation flat 14a are provided outside of the periphery by about 2 mm.

In this example, 8 jet holes consisting of two jet holes ($17a$, $17a'$), ($17b$ $17b'$), ($17c$, $17c'$) and ($17d$, $17b'$) forming a pair are provided in total. Of course, the present invention is not limited to the specific example. Each pair is independently connected with each of the gas supply systems 8d, 8e, 8f and 8g. For example, in the case where the sheet-like base is shifted away from a predetermined position to the right upward in the drawing, its position can be adjusted to the predetermined position when gas is blown out from the two jet holes ($17a$, $17a'$) disposed upward on the right. At this time, either the gas blown out from other jet holes is stopped or the gas is blown out with a pressure lower than that of the gas blown out from the jet holes ($17a$, $17a'$).

As described above, when the jet holes for controlling in a radial direction are supplementary provided, it becomes possible to quickly conduct a fine adjustment on the position of the sheet-like base. In order to improve the accuracy of position adjustment, it is preferable that the jet holes are provided on the periphery of the sheet-like base. Especially, in the case of a sheet-like base having an orientation flat, it is preferable that the jet holes ($17a$, $17a'$) are disposed close to the center correspondingly to the orientation flat.

Figure 7:
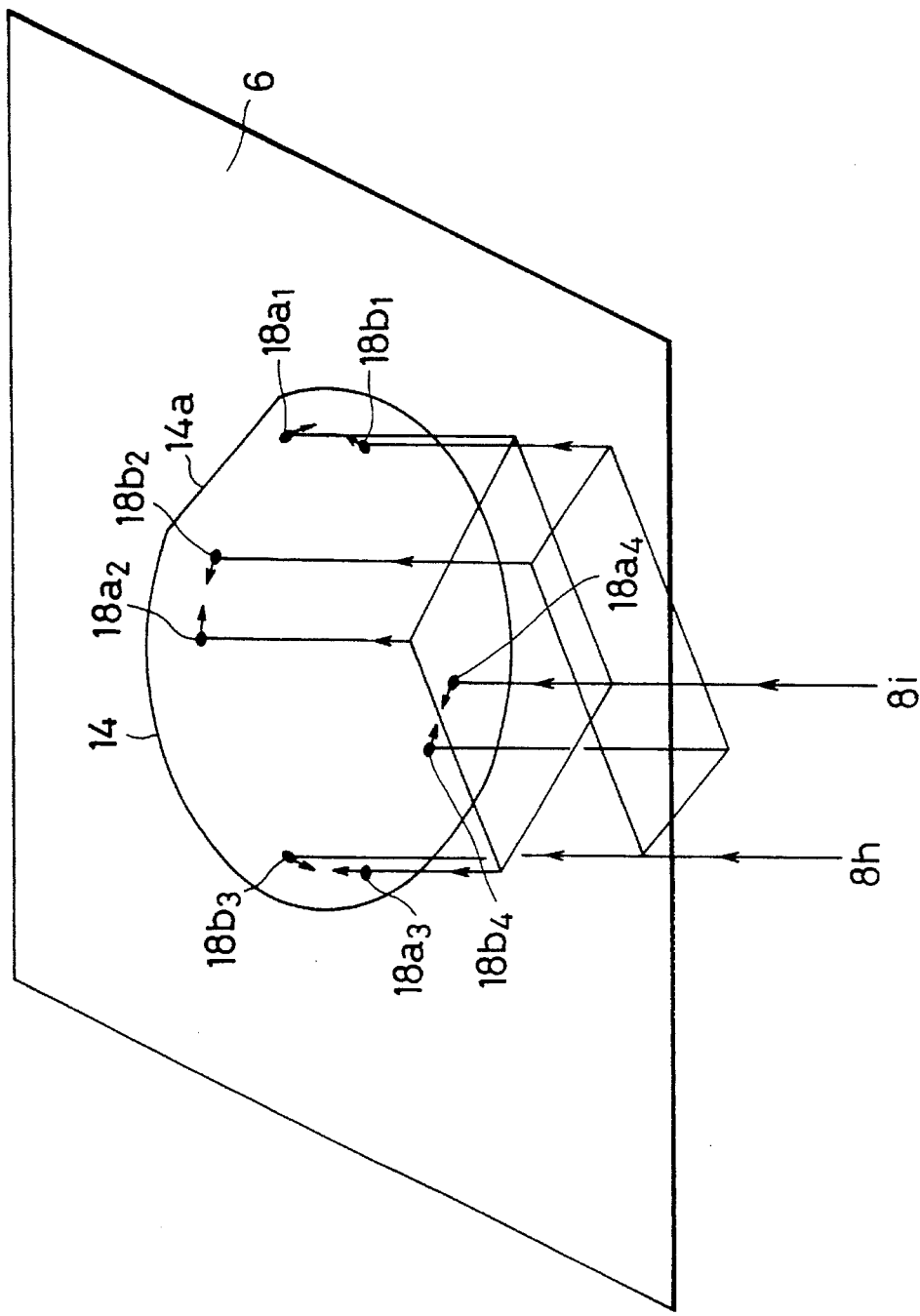
FIG. 7 is a perspective view showing the arrangement of jet holes for controlling in a rotational direction of the control unit of the carrying device of the example of the present invention.

Next, with reference to FIG. 7, the jet holes for controlling the rotation will be explained as follows.

These jet holes $18a_1$, $18a_2$, $18a_3$, $18a_4$, $18b_1$, $18b_2$, $18b_3$, $18b_4$ for controlling the rotation are provided to control rotational direction. The jet holes for controlling the rotation are provided in the periphery of the sheet-like base. From the viewpoint of adjusting the position with high accuracy in a short period of time, the jet holes for controlling the rotation are preferably provided on a circumference with a radius being ¼ to ⅓ of the radius of the sheet-like base.

The jet holes for controlling the rotation are open facing the circumferential direction, with some of them being open clockwise, and the other are open counterclockwise. The jet holes open clockwise and the jet holes open counterclockwise are respectively connected to the separate gas supply systems 8h and 8i.

For example, in order to rotate the sheet-like base clockwise, the gas supply system 8h may be turned on so that the gas can be blown out from the jet holes opening clockwise.

Concerning the interval between pairs of jet holes ($18a_1$, $18b_1$), ($18a_2$, $18b_2$), ($18a_3$, $18b_3$) and ($18a_4$, $18b_4$) for controlling the rotation, for example, the interval between the jet holes $18a_1$ and $18b_1$ is preferably 1 to 5 cm, and the jet holes for controlling the rotation are preferably disposed in a range not more than 70 to 80% of the diameter of the wafer. When the jet holes are disposed the in the aforementioned range, the rotational direction can be controlled with high accuracy.

Figure 8B:
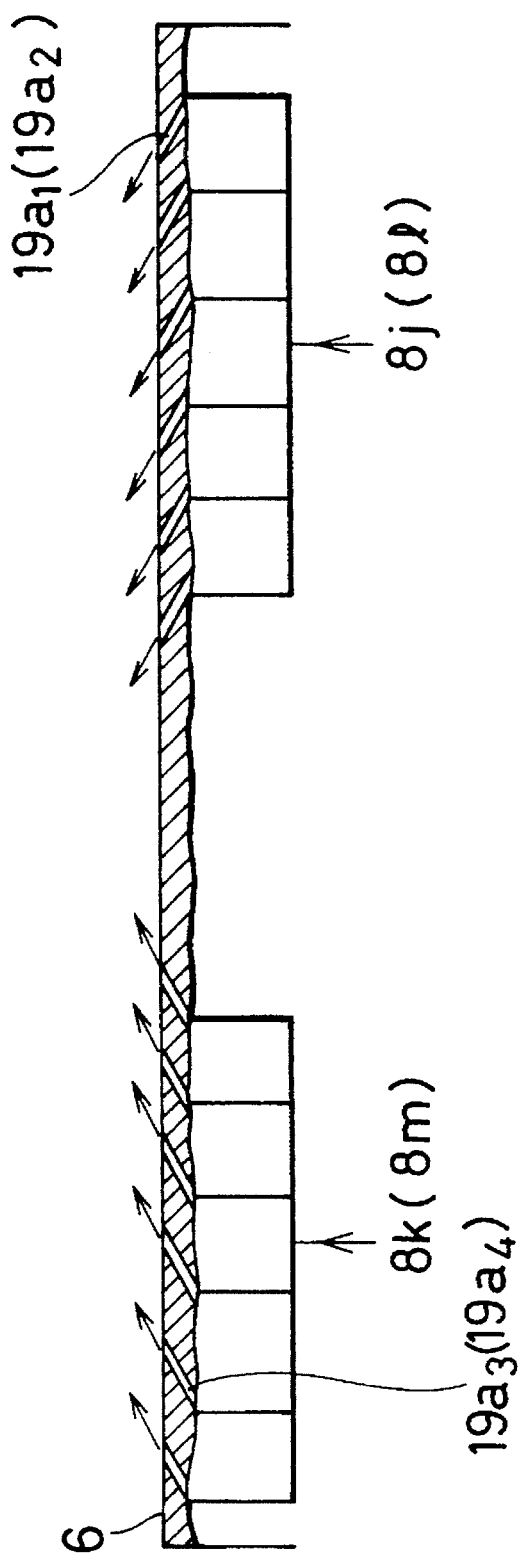
FIG. 8(b) is a sectional view taken on line 1—1 in FIG. s(a)

Next, with reference to FIGS. 8(a), 8(b) and 8(c), the jet holes for carrying and stopping will be explained as follows. FIG. 8(a) is a plan view. FIG. 8(b) is a sectional view taken on lines 1—1 and 2—2 in FIG. 8(a). The sectional views taken on lines 1—1 and 2—2 are identical. FIG. 8(c) is a sectional view taken on line 3—3 and 4—4 in FIG. 8(a). The sectional views taken on lines 3—3 and 4—4 are identical. The example shown in FIG. 8, Is the case where the sheet-like base is carried and stopped in the direction of X-axis or Y-axis. Also a part of jet holes $19a_1$ and $19a_3$ for carrying and stopping are aligned in two lines and disposed on lines which are parallel to the X-axis. The jet holes $19a_2$ and $19a_4$ for carrying and stopping are aligned in two lines and disposed on lines which are parallel to the Y-axis. The other jet holes $20a_1$ and $20a_3$ are linearly disposed on X-axis. In the same manner, the jet holes $20_2$ and $20a_4$ are disposed on Y-axis. The jet holes $19a_1$ and $19a_3$ for carrying and stopping are disposed in parallel with X-axis and open toward the control center. The jet holes $19a_2$ and $19a_4$ for carrying and stopping are disposed in parallel with Y-axis and open toward the control center. On the other hand, the jet holes $20a_1$ and $20a_3$ for carrying and stopping are disposed in parallel with X-axis and open to the opposite side from the control center, and the jet holes $20a_2$ and $20a_4$ for carrying and stopping are disposed in parallel with Y-axis and open to the opposite side from the control center. The Jet holes $19a_1$ and $20a_3$ are independently connected with the gas supply system $8j$, and the jet holes $19a_2$ and $20a_4$ with the gas supply system $81$. The Jet holes $19a_3$ and $20a_1$ are independently connected with the gas supply system $8k$, and the jet holes $19a_4$ and $20a_2$ with the gas supply system $8m$.

Accordingly, for example, in the case where a sheet- like base is carried in the direction of X-axis, gas is blown out from the jet holes $19a_1$ and $20a_3$ for carrying and stopping when the gas supply system $8j$ is turned on, so that the sheet-like base is braked and then stopped. In this case, other gas supply systems are maintained off.

Next, in the case where the sheet-like base is carried in the direction of Y-axis, gas is jetted from the jet holes $19a_4$ and $20a_2$ for carrying and stopping when the gas supply system $8k$ is turned on, so that the sheet-like base is carried in the direction of Y-axis. In this case, other gas supply systems are kept turned off.

In the various jet holes described above, their inner diameters are preferably not more than 1.0 mm, and more preferably not more than 0.8 mm. When the inner diameters are determined to be not more than 1.0 mm, the amount of gas blown out from one jet hole can be stabilized, and a sudden increase of said amount of gas can be prevented.

Also, at least the surfaces of the transfer and control units that come into contact with the gas are preferably mirror-like surfaces with Rmax value of not more than 1 μm and without any processing affected zones. When the surface is formed in the aforementioned manner, it is possible to prevent gas (for example, moisture) from being released from the surface, which Is effective to prevent impurities from being mixed with the gas for carrying. Therefore, it becomes easy to maintain the concentration of impurities in the gas for carrying to be not more than several ppb.

Especially when a passive state film is formed on the surface of a stainless steel by heat treating the stainless steel (preferably to a temperature of 400° to 550° C.) in oxidizing gas having an impurity concentration of not more than several ppb, not only the amount of gas released from the surface of the stainless steel becomes extremely small, but having also antiabrasion properties, generation of particles created by contact with gas for carrying can be substantially reduced. In this case, the thickness of the aforementioned passive state film is preferably not less than 10 nm.

Furthermore, when the gas system is made in a closed circulating system which will be described later, particles are mostly generated from the sliding surfaces inside the circulation pump and the vacuum exhaust pump. However, when the sliding surfaces are made with a mirrorlike passive state film provided by heating a stainless steel sheet in oxidizing gas with impurity concentration of not more than several ppb, and the Rmax value of the mirrorlike passive state film being not more than 1 μm, the generation of the aforementioned particles can be inhibited to not more than several ppb.

Next, the neutralization of electrical charge in the sheet-like base will be explained as follows. The sheet-like base is sometimes electrically charged when it Is carried or processed. Under the charged condition, particles tend to be deposited on the sheet-like base. Further, when the electrically charged sheet-like base is carried to the next process, it is difficult to perform a predetermined process. For example, in the case where ions are injected into a sheet-like base or wafer which is electrically charged, it is impossible to inject ions the intended distance.

Figure 9:
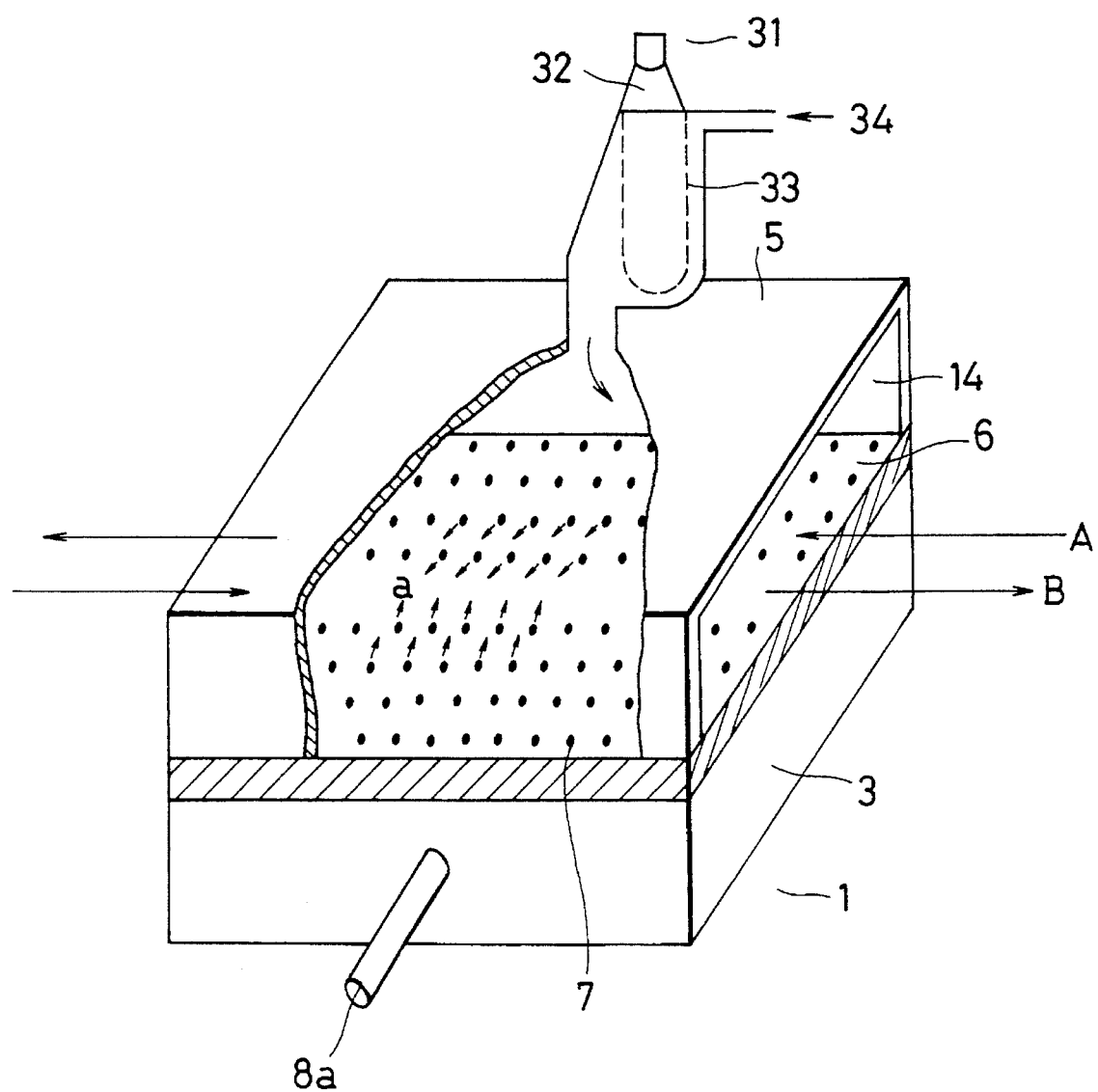
FIG. 9 is a perspective view showing the example in which an ion neutralizing means is provided.

This example describes how to neutralize a sheet-like base electrically charged while being carried. FIG. 9 shows its structure. In order to neutralize the electrical charge generated when a sheet-like base is carried, an ion generation means 31 is provided in this example. The ion generation means 31 may be composed, for example, of an ultraviolet ray irradiating lamp 32, a metallic mesh 33 (an electron emitting section from which electrons are emitted by the photoelectric effect), and a negative ion source gas 34. When the metallic mesh 33 is irradiated with ultraviolet rays emitted by the ultraviolet ray irradiating lamp 32, electrons are generated by the photoelectric effect. These electrons when combined with the negative ion source gas, generate negative ions. The negative ions are introduced into a transfer unit carried by a current of negative ion gas, and neutralize the electrically charged sheet-like base. Incidentally, the metal used for the metallic mesh 33 may be appropriately selected from metals capable of emitting electrons by the photoelectric effect when it is irradiated with ultraviolet rays and by combining with the wavelength of the emitted ultraviolet rays. For example, hydrogen gas or nitrogen gas, with impurity concentration of not more than several ppb, is used for the negative ion gas source. When the electrically charged sheet-like base is neutralized by negative ions in the aforementioned manner, neutralization can be carried out without causing disturbance in the current of carrying gas. That is, in the case where neutralization is conducted by the action of electrons, a large amount of gas flow is required for sending the electrons to the sheet-like base. Accordingly, there is a possibility that the current of carrying gas is disturbed probably because the mass of electrons being so small they easily flow into the inner wall, therefore it is necessary to make a gas current going against for preventing the electrons from flowing into the inner wall which necessarily requires a large amount of flow of the gas current. In contrast, the mass of negative ions is far larger than that of electrons, so that the negative ions can be easily carried to the sheet-like base by the gas current. Therefore, the current of carrying gas is not disturbed.

In this example, the ion generation means is provided above the transfer unit, however, it may be provided above the control unit, or above both the control unit and the transfer unit. Although the current of carrying gas is hardly disturbed when the ion generation device is provided, the ion generation device is preferably provided above the transfer unit in order to further reduce its influence.

Next, the combination of the control and transfer units will be explained.

Figure 10A:
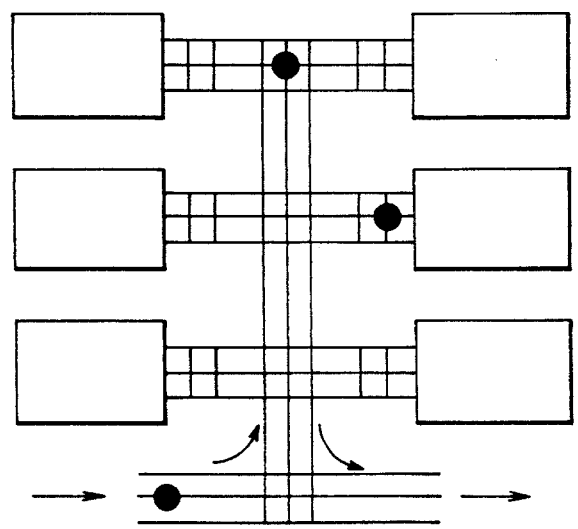
FIGS. 10(a), 10(b) and 10(c) are schematic illustrations showing the concept of combination of transfer and control units.
Figure 10B:
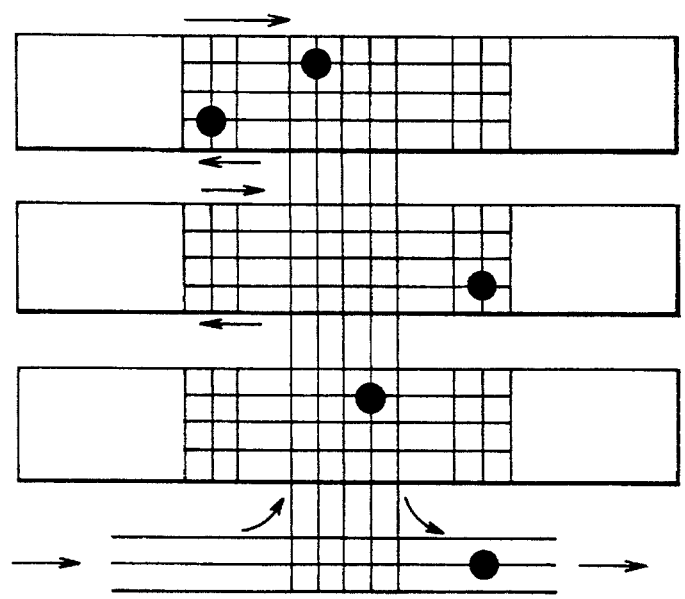
Figure 10C:
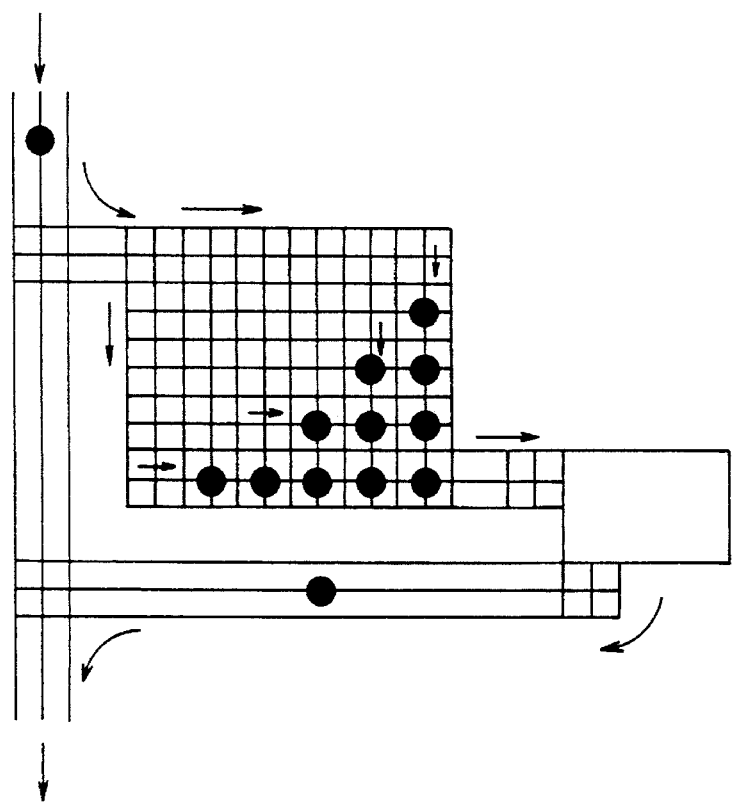

The control and transfer units can be arbitrarily combined. For example, they can be combined In the manner shown in FIGS. 10(a), 10(b) and 10(c).

It is preferable that they are combined through a metallic gasket or a metallic O-ring, and it is further preferable that the leakage of each portion is not more than $10^{-10}$ [torr·1/s].

Next, the gas supply system and the exhaust system will be explained.

The vacuum exhaust holes 11 formed on the lower surfaces of the transfer and control spaces are connected to the buffer tank 21 through the ultra-clean vacuum exhaust pump 13. Also, the exhaust means provided in the transfer and control spaces are connected to the buffer tank 21. The gas accumulated in the buffer tank 21 after being made in a high purity gas by going from the buffer tank 21 through a circulation pump 22, filter 23 and gas purifying unit 24, the gas is supplied to the gas supply systems 8a to 8m. When the gas is supplied to the basic gas supply pipes of the gas supply systems 8a to 8m, new gas may be added from a clean gas cylinder 25 in addition to the circulated gas which has passed through the aforementioned gas passage.

Ultra-high purity inert gas (the concentration of impurities such as water is not more than 10 ppb) is used for the gas to be supplied. Also the jetting speed of the gas is not higher than 200 m/sec. In the case where the jetting speed is higher than 200 m/sec, erosion Is caused by the gas, which generates particles and deteriorates the processability of the sheet-like base.

As described above, since the gas system is separated from the atmosphere and the generation of impurities is inhibited inside the system, the impurity concentration of carrying gas can be always maintained to be not more than several ppb, and the contamination of the sheet-like base caused by impurities can be prevented while the sheet-like base is being carried.

Although the illustrations are omitted in this example, it is preferable that this device is put on an appropriate vibration absorbing device in order to absorb the vibrations transmitted from the outside.

[EXAMPLE OF OPERATING PROCEDURE]

In order to transfer a sheet-like base, the aforementioned sheet-like base carrying device is operated in the following manner.

An example is taken in which a sheet-like base sent into a control unit from the direction X, is carried in the direction Y in FIG. 8(a).

DECELERATION AND STOP

When the sheet-like base sent into the control unit is detected, simultaneously the gas supply system 8j is turned on. Also, the gas supply system 8b is turned on. In this case, the gas supply system 8b is always kept turned on during subsequent procedure.

When the gas supply system 8j is turned on, gas is blown out from the jet holes $19a_1$, $20a_2$ for carrying and stopping, and the sheet-like base is decelerated by the action of the blown out gas. At this time, when the speed of the sheet-like base is detected, and the pressure or amount of the blown out gas is controlled in accordance with the detected speed, the sheet-like base approximately can be stopped in a position where the center of the sheet-like base coincides with the control center 11. By appropriately repeating the turn on and off of the gas supply systems 8j, 8k, 8l and 8m, or stepwise minute adjustment of the amount of blown out gas, the sheet-like base can be stopped while the center of the sheet-like base almost coincides with the control center 11. At this time, the amount of blown out gas may be made smaller than that blown out from the gas supply system 8j when the sheet-like base is decelerated.

CONTROL IN RADIAL DIRECTION

Next, the gas supply system 8c is turned on. At this time, the gas supply systems 8j to 8m are turned off. When the gas supply system 8c is turned on, gas is blown out from the jet holes 16 for controlling in radial direction, so that the center of the sheet-like base almost perfectly coincides with the control center.

CONTROL IN ROTATIONAL DIRECTION

Next, the gas supply systems 8h to 8i are turned on. By adjusting the amounts of gas sent from the gas supply systems 8h to 8i adjustment of the position of the sheet-like base with respect to the rotational direction while considering the crystal orientation of the sheet-like base is performed.

SUCTION

Next, after the gas supply systems 8h to 8j have been turned off, the ultra-clean exhaust pump 13 is driven to perform vacuum suction through the suction hole 11. By the suction through the suction hole 11, the sheet-like base Is stopped in a predetermined position. At this time, the gas supply system 8b maintains the condition of being turned on, and because the gas is always blown out from the jet holes 17 of gas for floating toward the control center, the sheet-like base is maintained in a floating condition.

FINE ADJUSTMENT

By repeatedly turning on and off the gas supply systems 8d to 8g, and again repeatedly turning on and off the gas supply systems 8h to 8i, the position of the sheet-like base is controlled. At this time, the position of the sheet-like base is controlled with the accuracy of not more than ±0.2 min.

DELIVERY

Next, the gas supply systems 8c to 8i are turned off, and at the same time the operation of the ultra-clean exhaust pump 13 is stopped. Then, the gas supply system 8k is turned on, and gas is blown out from the jet holes $19a_1$ and $20a_2$ of the gas for stopping and carrying, so that the sheet-like base is carried in the direction Y. At this time, the gas supply system 8a of the transfer unit located in the direction Y is also turned on, so that the sheet-like base is allowed to pass through the transfer space in the transfer unit at a constant speed and carried to the next control unit.

In order to conduct the aforementioned operation, It is necessary to detect the position (including the orientation) of the sheet-like base. Therefore, an appropriate detection means may be provided.

Figure 11:
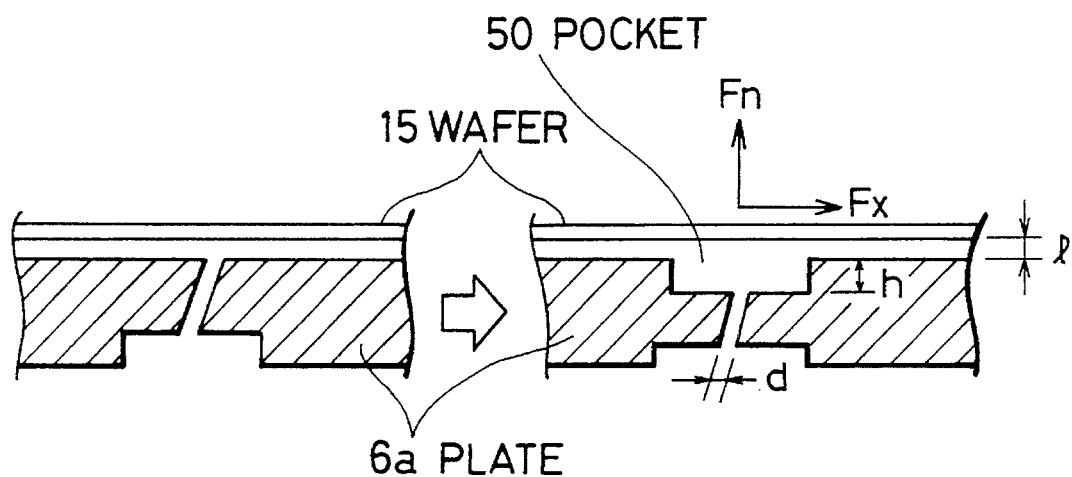
Figure 12:
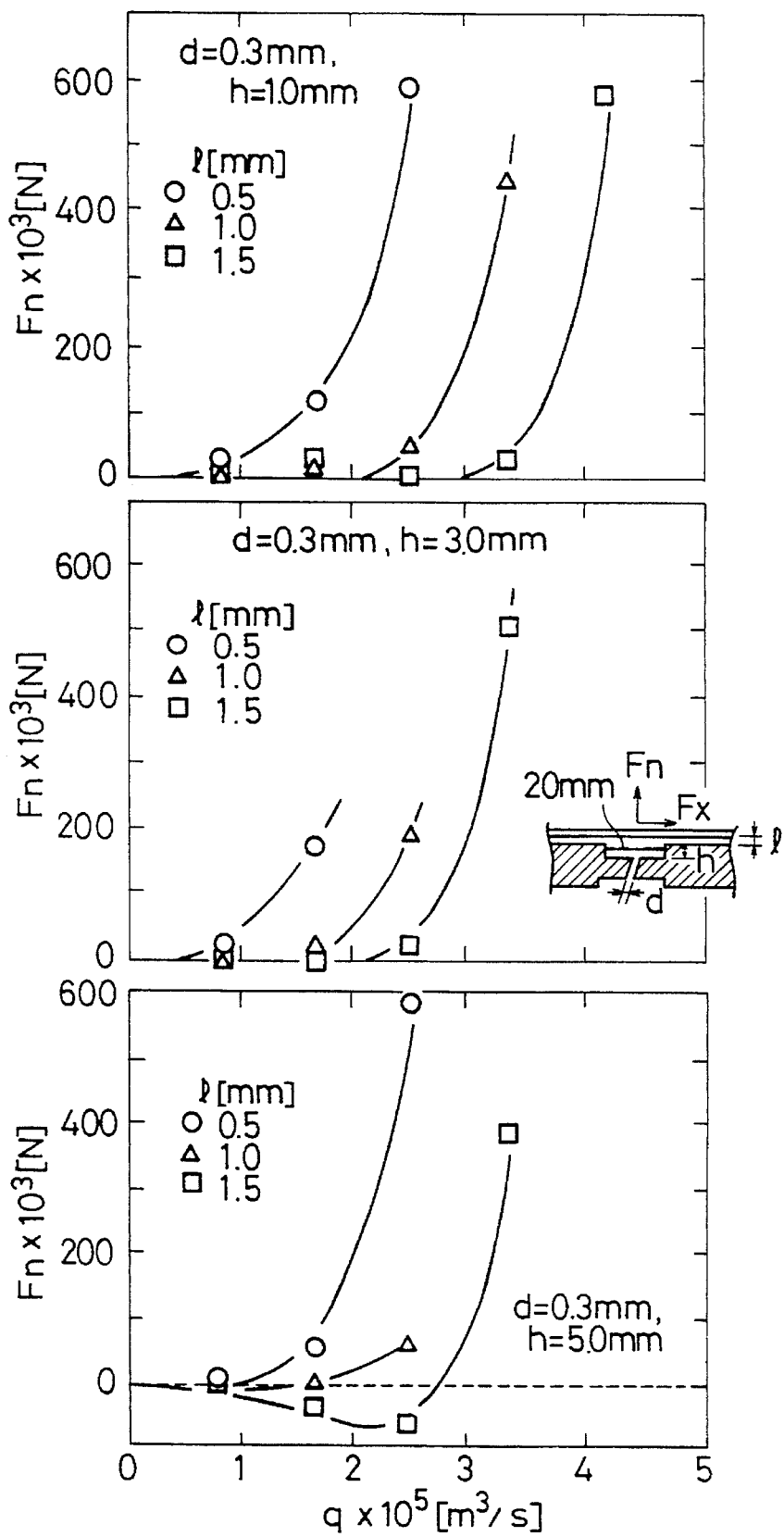
Figure 13:
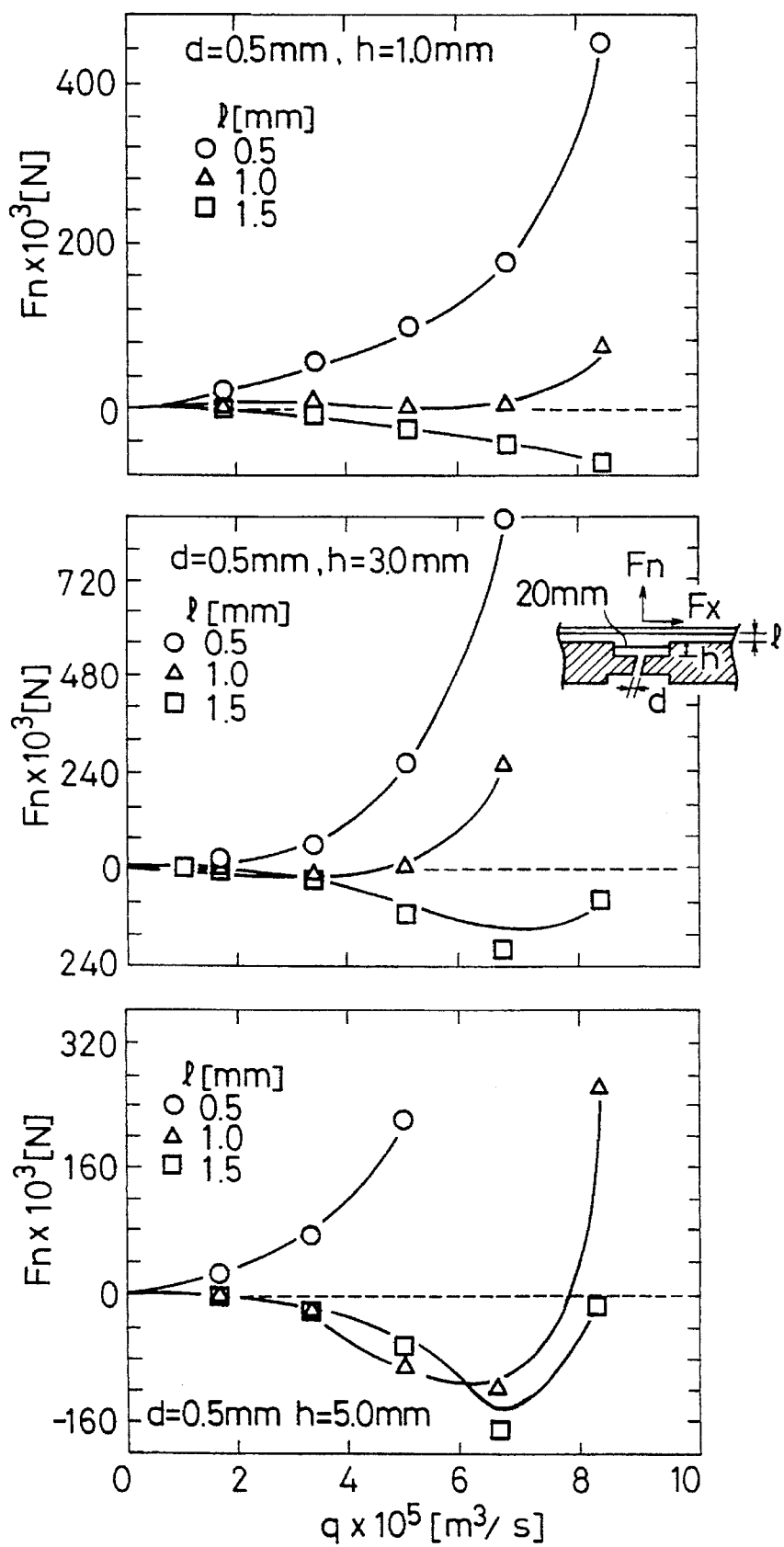
Figure 14:
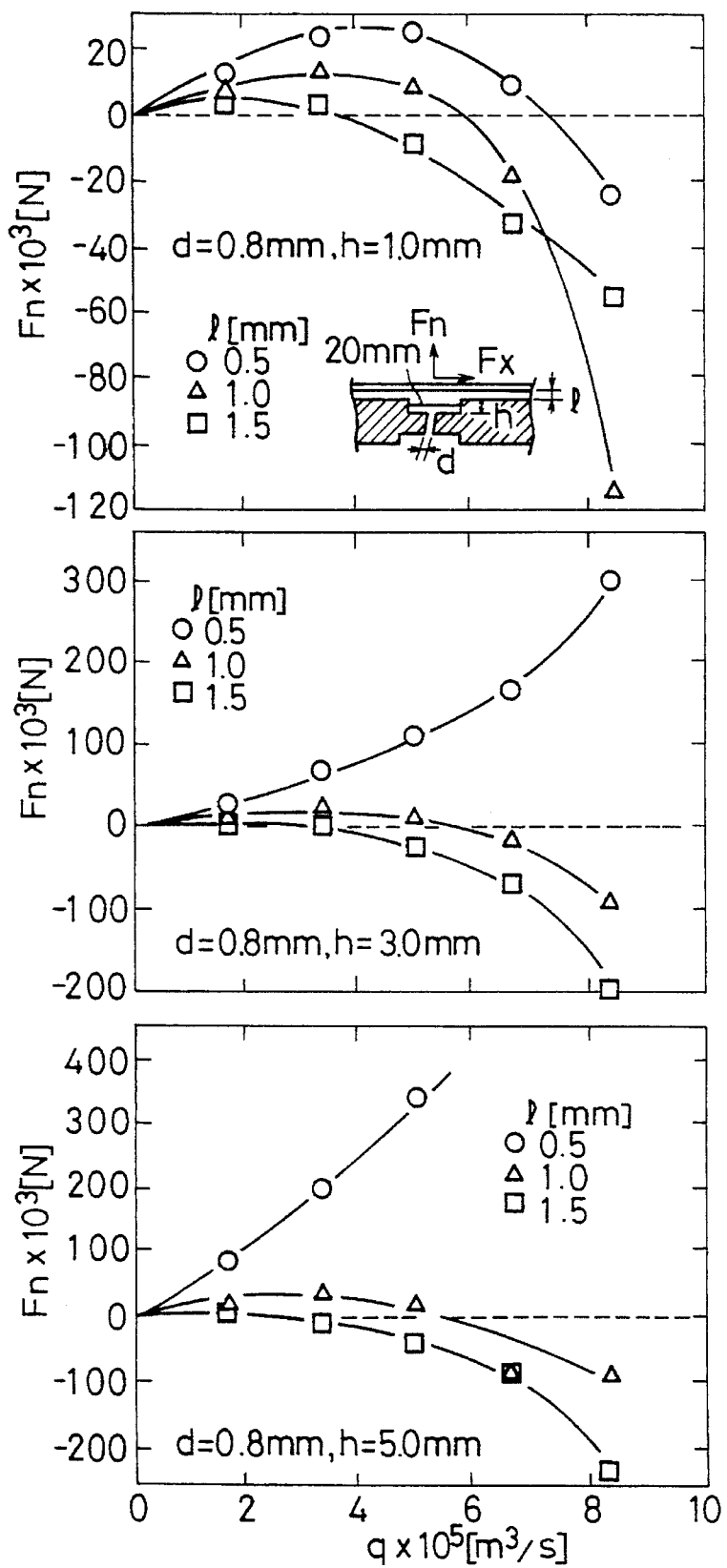
Figure 15:
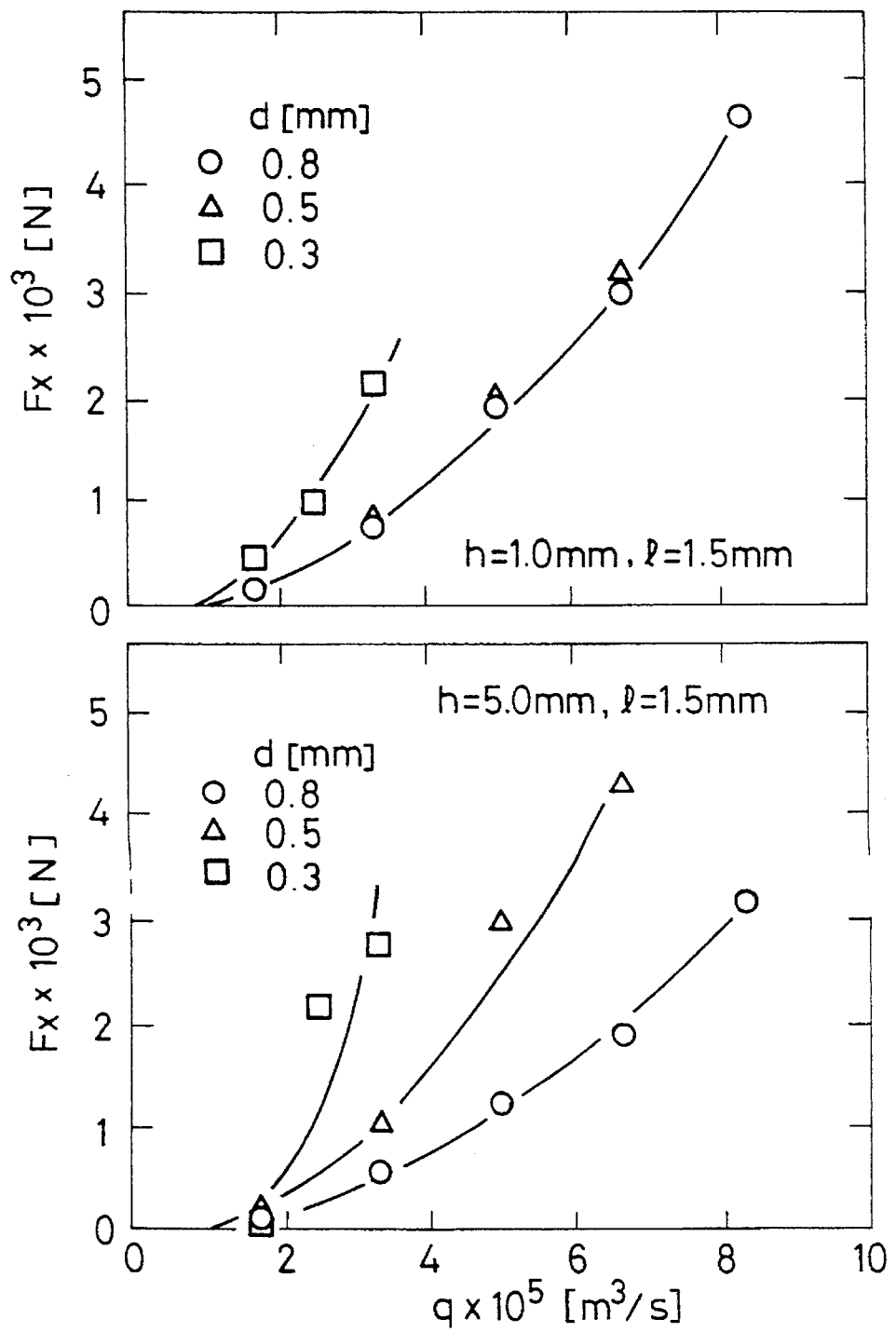
Figure 17:
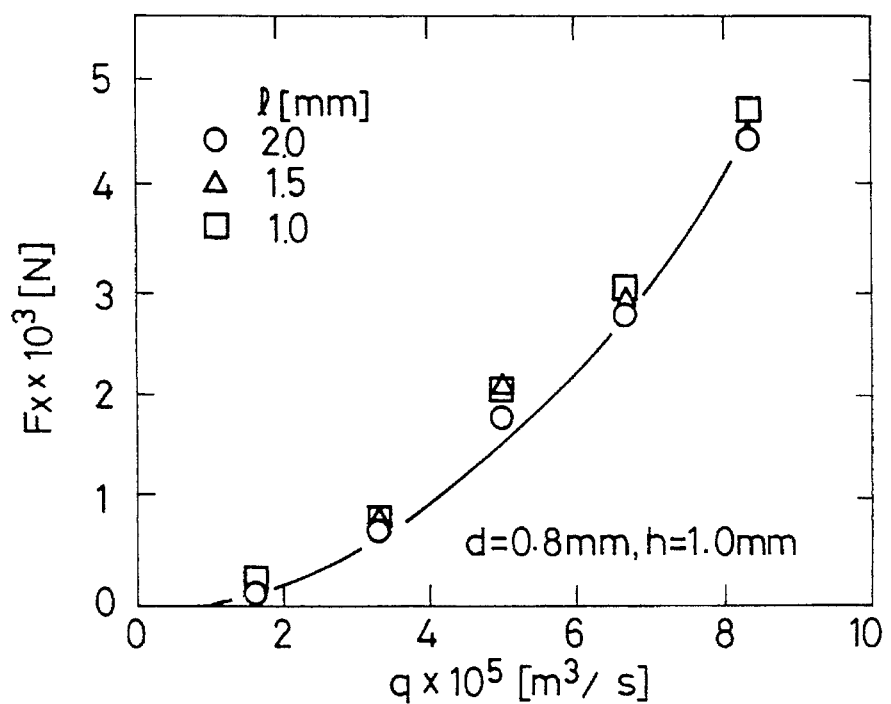

Next, a case will be described in which a pocket 50 is provided in each jet hole of the plate 6 as shown in FIG. 11. When the pocket is provided in the manner described above, it is possible to reduce the amount of gas to carry a wafer as shown in the graphs of FIGS. 12 to 16.

Figure 18:
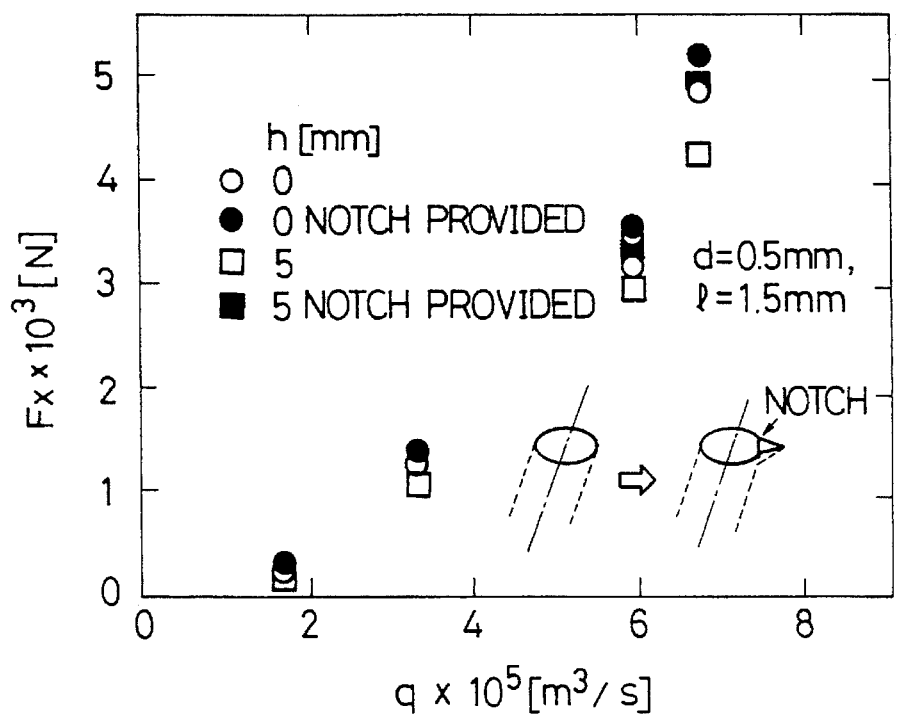

Also, it is preferable that a notch is provided in the jet hole as shown in FIG. 18.

Figure 19A:
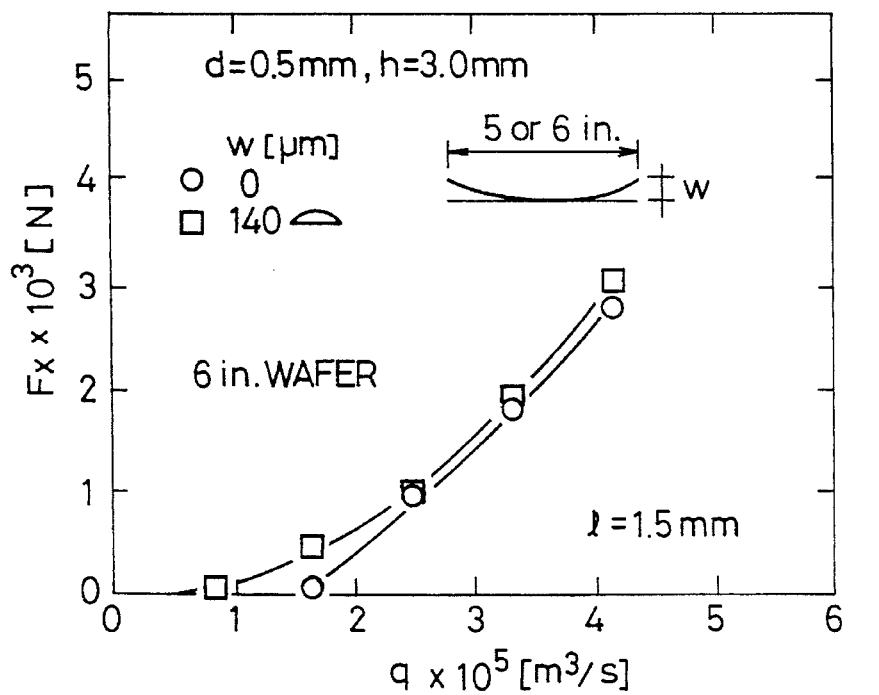
Figure 19B:
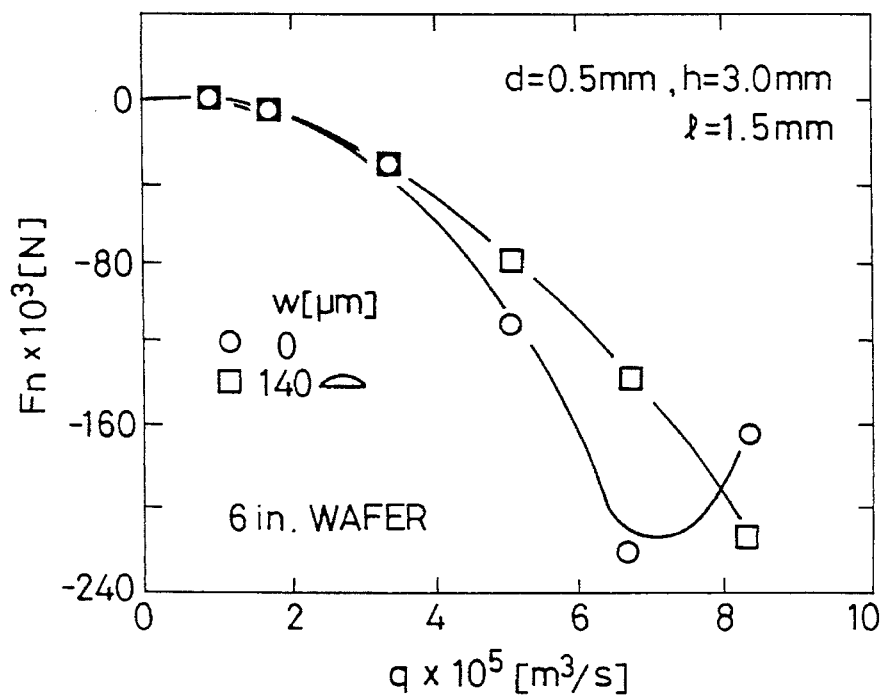
Figure 20A:
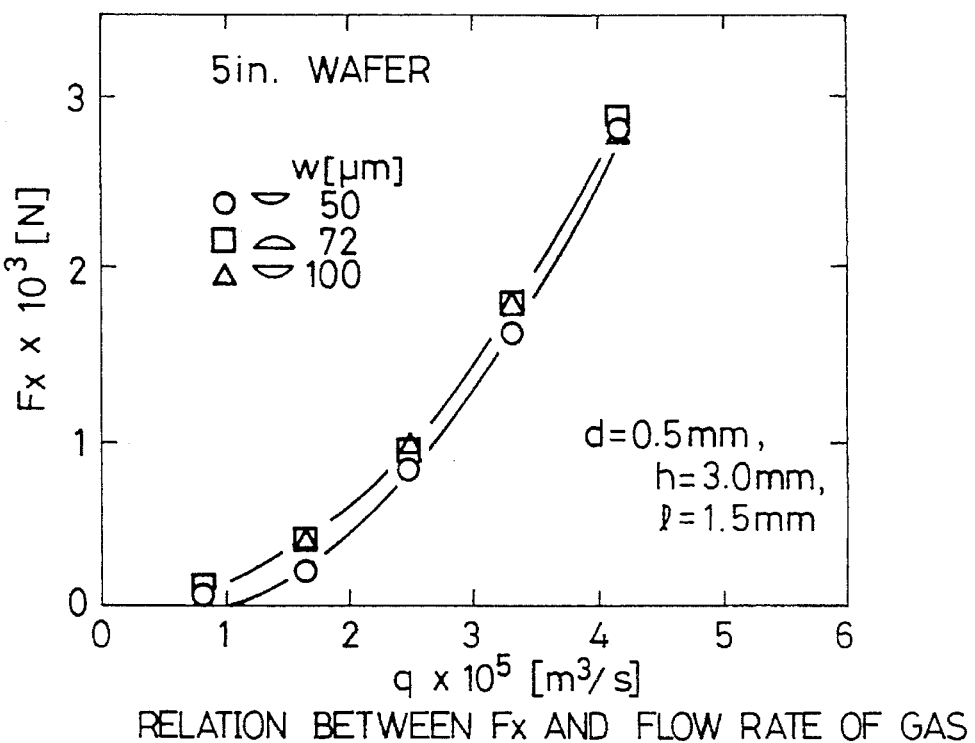
Figure 20B:
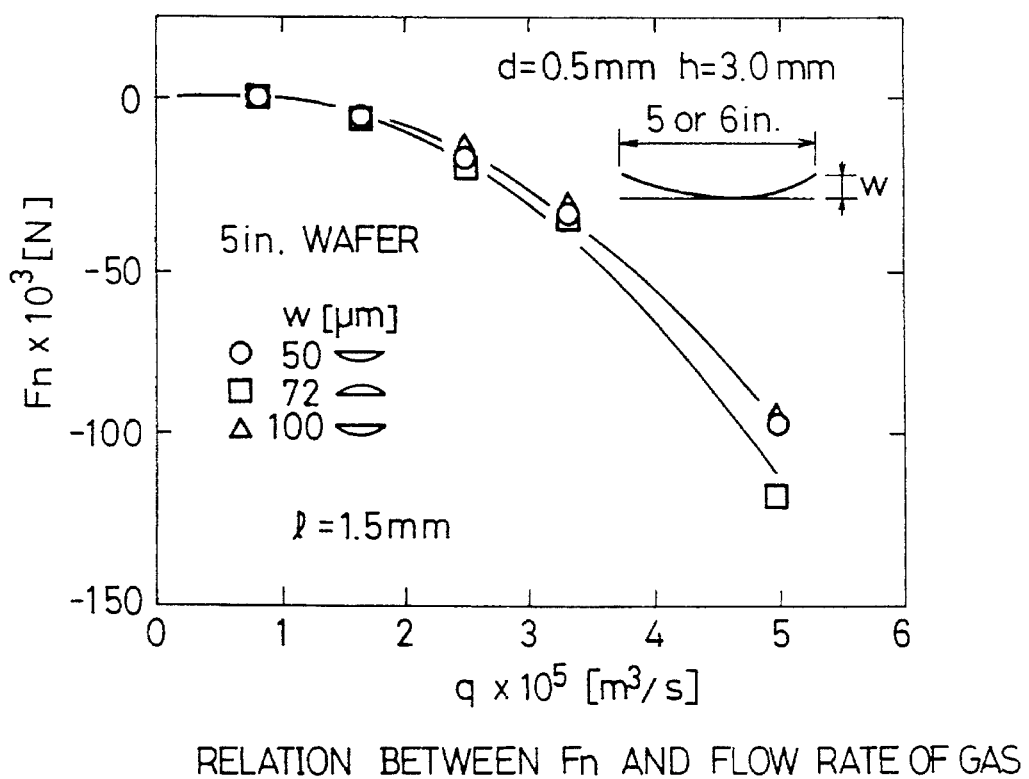
Figure 21:
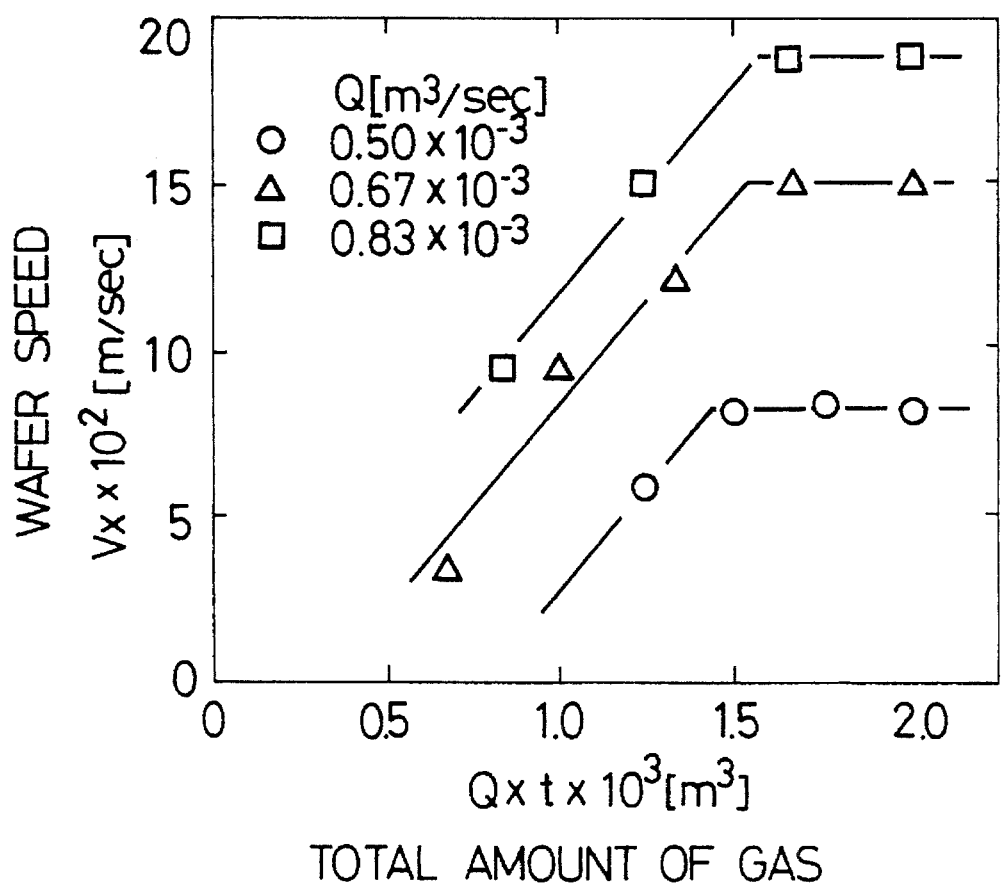
Figure 22A:
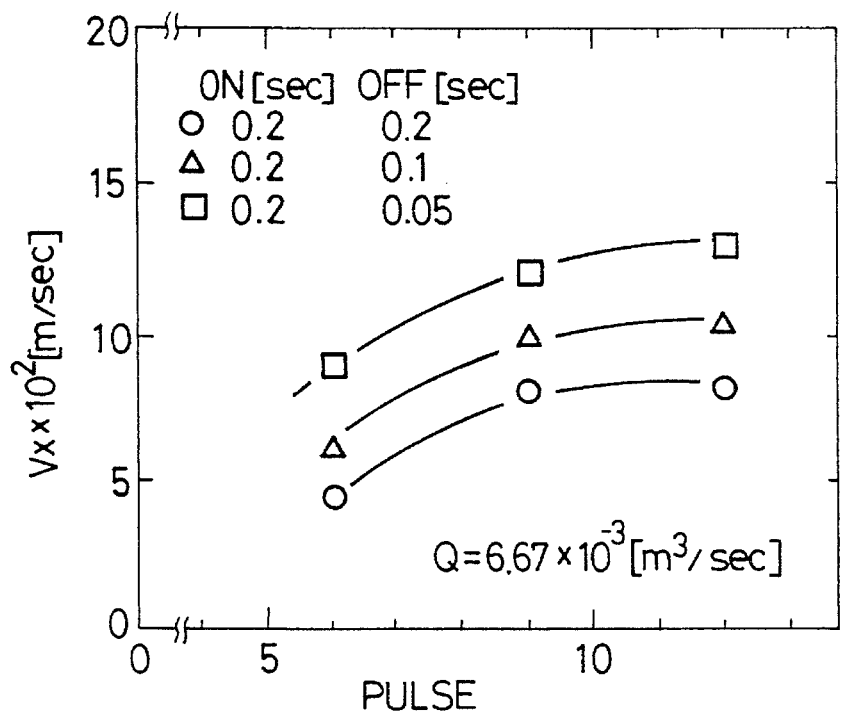
Figure 22B:
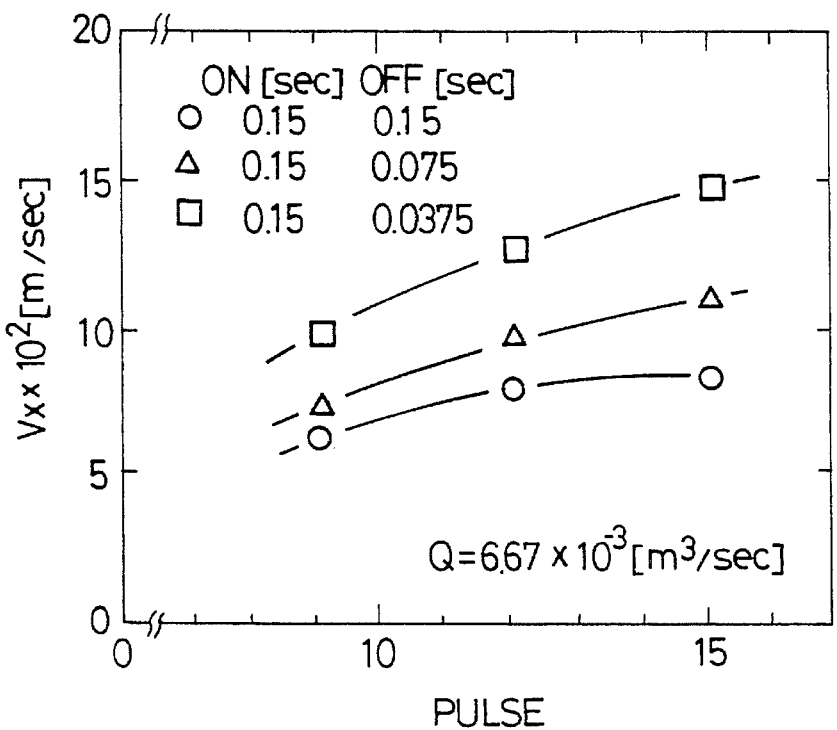

Incidentally, the deformation of a wafer caused by gas pressure is shown in FIGS. 19 and 20.

INDUSTRIAL APPLICABILITY

According to the present invention, it is possible to maintain a sheet-like base in a stationary condition with an accuracy of ±0.2 mm while the sheet-like base is being floated, and also it is possible to prevent the contamination of the sheet-like base while being carried.

[DESCRIPTION OF REFERENCE SYMBOLS]

1 transfer unit
2 control unit
3 base
4 transfer space
5 surrounding member
6 lower surface
6a a plate
7 jet holes for floating
8a to 8m gas supply system
9a to 9b exhaust means
10 gas exhaust line
11 suction hole
12 vacuum exhaust line
13 ultra-clean exhaust pump
13 ultra-clean vacuum exhaust pump
14 periphery of a sheet-like base
14a a orientation flat
15 sheet-like base (wafer)
17 jet holes for floating
16 jet holes for controlling in a radial direction
17a, 17a', 17b, 17b', 17c, 17c', 17d, 17d' jet holes for fine adjustment
$18a_1$, $18b_1$, $18a_2$, $18b_2$, $18a_3$, $18b_3$, $18a_4$, $18b_4$ jet holes for rotational control
$19a_1$, $19a_3$, $19a_2$, $19a_4$, $20a_1$, $20a_3$, $20a_2$, $20a_4$ jet holes for sending and stopping
21 buffer tank
22 ultra-clean circulation pump
23 filter
24 gas purifying unit
25 clean gas cylinder
31 ion generation means
32 metallic mesh
33 negative ion source gas
42 groove

We claim:

1. A wafer positioning and transporting apparatus comprising:

a plurality of transfer units, each said transfer unit defining a transfer space for enabling linear travel of a said wafer, a first said transfer space having a first bottom surface;

a plurality of control units, each said control unit defining a control space for controlling positioning and movement of a said wafer, a first said control space having a first lower surface;

said plurality of transfer units and said plurality of control units sealingly interconnected;

a first plurality of jet holes in said first bottom surface, said first plurality of jet holes connected to a gas supply means for delivering gas to said first transfer space;

a first exhaust means in said first transfer space for exhausting gas from said first transfer space;

a second exhaust means in a first said control space for exhausting gas from said first control space, the central portion of the said first lower surface defining a control center for alignment with the center of a said wafer for control of a said wafer;

a suction hole disposed in said control center, said suction hole connected to a third vacuum exhaust means for exhausting gas through said suction hole;

a second plurality of jet holes in said first lower surface for controlling the radial position of a said wafer;

a third plurality of jet holes in said first lower surface for controlling the circumferential position of a said wafer;

a fourth plurality of jet holes in said first lower surface for floatingly supporting said wafer;

a fifth plurality of jet holes in said first lower surface for transporting and stopping a said wafer; and a groove in said first lower surface, said groove connected to said suction hole, said groove including a closed end, said closed end located inside the periphery of a said wafer when a said wafer is positioned above and centered with respect to said control center.

2. The apparatus according to claim 1, wherein said first plurality of jet holes is substantially perpendicular to the direction of travel of a said wafer and open upwardly.

3. The apparatus according to claim 1, wherein said second plurality of jet holes is provided at the periphery of a said wafer when the center of the said wafer is positioned above and centered on said control center.

4. The apparatus according to claim 1, wherein said second plurality of jet holes is provided outside the periphery of a said wafer when the center of the said wafer is positioned above and centered on said control center.

5. The apparatus according to claim 1, wherein said second plurality of jet holes includes a sixth plurality of jet holes located at the periphery of a said wafer, and a seventh plurality of jet holes located outside the periphery of a said wafer when the said wafer is positioned above and centered on said control center, said sixth and seventh pluralities of jet holes each respectively connected to first and second gas supply systems.

6. The apparatus according to claim 1, wherein said third plurality of jet holes is provided inside the periphery of a said wafer when the center of a said wafer is positioned above and centered on said control center, said third plurality of jet holes including an eighth plurality of jet holes which are open upwardly in a clockwise circumferential direction and a ninth plurality of jet holes which are open upwardly in a counterclockwise circumferential direction and wherein said eighth and ninth pluralities of jet holes each are respectively connected to first and second gas supply systems.

7. The apparatus according to claim 1, wherein portions of said bottom surface and said lower surface include a mirrorlike finish having an Rmax value of which is not more that 1 µm.

8. The apparatus according to claim 7, wherein said mirrorlike finish is composed of a surface of a passive state film formed on a stainless steel sheet by heating in oxidizing gas having an impurity concentration of not more than several ppb.

9. The apparatus according to claim 1, wherein an ion generation means is provided in one of said transfer space and control space, said ion generation means generating ions by the action of electrons emitted by the photoelectric effect.

10. The apparatus according to claim 1, wherein said third vacuum exhaust means comprises a vacuum exhaust pump, a circulation pump, filter and a gas purifying device, and wherein said first and second exhaust means are connected to said gas supply means through the said circulation pump, said filter and said gas purifying device, and wherein said gas supply means is sealed from the atmosphere.

11. The apparatus according to claim 10, wherein portions of said vacuum exhaust pump and said circulation pump which come into contact with gas are made of stainless steel, the surfaces of said portions including a passive state film which has a mirrorlike surface, the Rmax value of said mirrorlike surface being not more that 1 μm, said passive state film formed by heating stainless steel in oxidizing gas having an impurity concentration of not more than several ppb.

12. The apparatus according to claim 1, wherein the inner diameter of each said jet hole is not more than 1.0 mm.

* * * * *

UNITED STATES PATENT AND TRADEMARK OFFICE
CERTIFICATE OF CORRECTION

PATENT NO. : 5,518,360  
DATED : May 21, 1996  
INVENTOR(S) : Masayuko Toda, et al Page 1 of 3

It is certified that error appears in the above-indentified patent and that said Letters Patent is hereby corrected as shown below:

In the Abstract, line 1, after "device", insert --is provided--.
 line 1, delete "such as a" and insert therefor --or--.
 line 2, after "and" insert --for--.
 line 2, delete "its" and insert therefor --the--.
 line 2, after "position" insert --of the wafer--.
 line 4, delete "controlling" and insert therefor --control--.
 line 5, after "with" insert --both--.
 line 5, delete "thin plate-like substrate" and insert therefor --wafer--.
 line 6, delete ", and a" and insert therefor --.  A--.
 line 7, delete "them" and insert therefor --transferring and control units--.
 line 7, delete "in combination with each other in a sealingly state" and insert therefor --sealing interconnected--.
 line 8, delete "The controlling" and insert therefor --Each control--.
 line 8, delete ", further,".
 line 9, delete "controlling" and insert therefor --control--.
 line 10, delete "thin plate-like substrate" and insert therefor --wafer--.
 line 10, delete "its" and insert therefor --the--.
 line 11, delete "direction" and insert therefor --directions,--.
 line 11, after "respectively" insert --,--.

UNITED STATES PATENT AND TRADEMARK OFFICE
CERTIFICATE OF CORRECTION

PATENT NO. : 5,518,360  Page 2 of 3
DATED : May 21, 1996
INVENTOR(S) : Masayuko Toda, et al It is certified that error appears in the above-indentified patent and that said Letters Patent is hereby corrected as shown below:

line 12, delete "thin plate-like substrate or sending out it" and insert therefor --wafer and for transporting the wafer--.
   line 13, delete "too".
   line 13, after "space" insert --defined by each control unit--.
   line 13, delete "extending" and insert therefor --which extend--.
   line 15, delete "thin plate-like substrate," and insert therefor --wafer--.
   line 16, delete ", and they are" and insert therefor --The grooves have--.
   line 16, after "closed" insert --ends which are located inside the periphery of the wafer".
   lines 16 and 17, delete "on the insides of their circumferential part".
   lines 17 and 18, delete "thin plate-like substrate has coincided" and insert therefor --wafer is positioned above and centered on--.

UNITED STATES PATENT AND TRADEMARK OFFICE
CERTIFICATE OF CORRECTION

PATENT NO. : 5,518,360  
DATED : May 21, 1996  
INVENTOR(S) : Masayuko Toda, et al Page 3 of 3

It is certified that error appears in the above-indentified patent and that said Letters Patent is hereby corrected as shown below:

In the Abstract, line 18, delete "with".  
  line 18, delete "controlling" and insert therefor --control--.  
  line 18, delete "controlling" and insert therefor --control.--.

Signed and Sealed this

Seventeenth Day of September, 1996

Attest:

BRUCE LEHMAN

*Attesting Officer*      *Commissioner of Patents and Trademarks*